(12) United States Patent
Lee et al.

(10) Patent No.: US 9,947,707 B2
(45) Date of Patent: Apr. 17, 2018

(54) IMAGE SENSOR AND MANUFACTURING METHOD THEREOF

(71) Applicant: SAMSUNG ELECTRONICS CO., LTD., Suwon-si, Gyeonggi-Do (KR)

(72) Inventors: Yun-Ki Lee, Seoul (KR); Hye-Jung Kim, Bucheon-si (KR); Hong-Ki Kim, Hwaseong-si (KR); Kyung-Duck Lee, Seoul (KR)

(73) Assignee: SAMSUNG ELECTRONICS CO., LTD., Suwon-si, Gyeonggi-Do (KR)

( * ) Notice: Subject to any disclaimer, the term of this patent is extended or adjusted under 35 U.S.C. 154(b) by 83 days.

(21) Appl. No.: 14/836,402

(22) Filed: Aug. 26, 2015

(65) Prior Publication Data

US 2016/0064430 A1    Mar. 3, 2016

(30) Foreign Application Priority Data

Aug. 29, 2014    (KR) .......................... 10-2014-0114521

(51) Int. Cl.
*H01L 27/146* (2006.01)
*H04N 5/232* (2006.01)
(Continued)

(52) U.S. Cl.
CPC ...... *H01L 27/1463* (2013.01); *H01L 27/1464* (2013.01); *H01L 27/14623* (2013.01);
(Continued)

(58) Field of Classification Search
CPC ............. H01L 27/1463; H01L 27/1464; H01L 27/14687; H01L 27/14689; H01L 27/14627; H01L 27/14649; H01L 27/14623; H04N 5/3696; H04N 5/23212; H04N 5/335
See application file for complete search history.

(56) References Cited

U.S. PATENT DOCUMENTS 7,515,819 B2    4/2009    Takahashi
8,648,436 B2    2/2014    Toda
(Continued)

FOREIGN PATENT DOCUMENTS

JP    2005-175232    6/2005
JP    2012-038768    2/2012
(Continued)

*Primary Examiner* — Mekonnen Dagnew
(74) *Attorney, Agent, or Firm* — F. Chau & Associates, LLC

(57) ABSTRACT

An image sensor includes a semiconductor layer, a plurality of light sensing regions, a first pixel isolation layer, a light shielding layer, and a wiring layer. The semiconductor layer has a first surface and a second surface opposite to the first surface. The plurality of light sensing regions is formed in the semiconductor layer. The first pixel isolation layer is disposed between adjacent light sensing regions from among the plurality of light sensing regions. The first pixel isolation layer is buried in an isolation trench formed between the first surface and the second surface. The light shielding layer is formed on the second surface of the semiconductor layer and on some of the adjacent light sensing regions. The wiring layer is formed on the first surface of the semiconductor layer.

19 Claims, 20 Drawing Sheets

(51) Int. Cl.
 H04N 5/335 (2011.01)
 H04N 5/369 (2011.01)
(52) U.S. Cl.
 CPC .. *H01L 27/14627* (2013.01); *H01L 27/14649* (2013.01); *H01L 27/14687* (2013.01); *H01L 27/14689* (2013.01); *H04N 5/23212* (2013.01); *H04N 5/335* (2013.01); *H04N 5/3696* (2013.01)

(56) References Cited

U.S. PATENT DOCUMENTS

| | | | |
|---|---|---|---|
| 8,687,101 B2 | 4/2014 | Hirota et al. | |
| 2007/0090754 A1* | 4/2007 | Li | H01L 51/5284 313/506 |
| 2011/0227091 A1* | 9/2011 | Toda | H01L 27/1463 257/76 |
| 2012/0194696 A1 | 8/2012 | Ohshitanai et al. | |
| 2012/0194714 A1 | 8/2012 | Yamashita | |
| 2013/0021499 A1 | 1/2013 | Ui et al. | |
| 2013/0083230 A1 | 4/2013 | Fukuda | |
| 2013/0182158 A1 | 7/2013 | Kobayashi et al. | |
| 2014/0008514 A1 | 1/2014 | Hamada | |
| 2014/0139716 A1 | 5/2014 | Sasaki et al. | |
| 2014/0246714 A1* | 9/2014 | Lee | H01L 27/14623 257/294 |
| 2015/0002713 A1* | 1/2015 | Nomura | H04N 5/23212 348/302 |

FOREIGN PATENT DOCUMENTS

| | | |
|---|---|---|
| JP | 2012-084816 | 4/2012 |
| JP | 2013-041890 | 2/2013 |

\* cited by examiner

IMAGE SENSOR AND MANUFACTURING METHOD THEREOF

CROSS-REFERENCE TO RELATED APPLICATION

This application claims priority under 35 U.S.C. § 119 to Korean Patent Application No. 10-2014-0114521, filed on Aug. 29, 2014, in the Korean Intellectual Property Office, the disclosure of which is incorporated by reference herein in its entirety.

TECHNICAL FIELD

The present inventive concept relates to an image sensor and a manufacturing method thereof, and more particularly, to an image sensor having increased focusing performance and isolation characteristics between unit pixels, and a manufacturing method of the image sensor.

DISCUSSION OF THE RELATED ART

An image sensor that captures an image of an object and converts the image to an electrical signal may be used not only in consumer electronic devices such as a digital camera, a camera for mobile phones, a portable camcorder, or the like, but also in cameras mounted in automobiles, security devices, robots, or the like. A quality image may be captured using an image sensor that has superior autofocusing performance and an enhanced ability to isolate characteristics between unit pixels of the image sensor.

SUMMARY

According to an embodiment of the present inventive concept, an image sensor is provided. The image sensor includes a semiconductor layer, a plurality of light sensing regions, a first pixel isolation layer, a light shielding layer, and a wiring layer. The semiconductor layer has a first surface and a second surface opposite to the first surface. The plurality of light sensing regions is formed in the semiconductor layer. The first pixel isolation layer is disposed between adjacent light sensing regions from among the plurality of light sensing regions. The first pixel isolation layer is buried in a first isolation trench formed between the first surface and the second surface. The light shielding layer is formed on the second surface of the semiconductor layer and on some of the adjacent light sensing regions. The wiring layer is formed on the first surface of the semiconductor layer.

The semiconductor layer may include a silicon substrate, and the first surface may be a front surface of the silicon substrate, and the second surface may be a rear surface of the silicon substrate.

The adjacent light sensing regions may be separated by the first pixel isolation layer. The light sensing regions may be formed to abut on the first and second surfaces.

The adjacent light sensing regions may be separated by the first pixel isolation layer. The adjacent light sensing regions may be formed in the semiconductor layer from the second surface.

The adjacent light sensing regions may be spaced apart from the first pixel isolation layer.

The first isolation trench may be formed in a first direction extending from the second surface to the first surface or in a second direction extending from the first surface to the second surface. The first isolation trench may abut on the first and second surfaces. The first pixel isolation layer may be an insulation material layer buried in the first isolation trench.

The first isolation trench may be formed in a first direction extending from the second surface to the first surface. The first isolation trench may be spaced apart from the first surface. The first pixel isolation layer may be an insulation material layer buried in the first isolation trench.

The first isolation trench may be formed in a second direction extending from the first surface to the second surface. The first isolation trench may be spaced apart from the second surface. The first pixel isolation layer may be an insulation material layer buried in the first isolation trench.

A second isolation trench may be further formed, in the semiconductor layer, in a first direction extending from the second surface to the first surface. A second pixel isolation layer may be formed by burying an insulation material layer in the second isolation trench. The second isolation trench may abut on the first isolation trench.

The second pixel isolation layer may be formed to abut on the first pixel isolation layer.

The second pixel isolation layer may be formed to be spaced apart from the first pixel isolation layer.

The second isolation trench may have a width decreased in the first direction.

A liner layer may be further formed on an inner wall of the first isolation trench.

An insulation layer may be formed on the second surface of the semiconductor layer, and the light shielding layer may be formed in the insulation layer.

An insulation layer may be formed on the second surface of the semiconductor layer, and the light shielding layer may be formed directly on the second surface of the semiconductor layer.

The first pixel isolation layer may be formed of a material having a lower refractive index than a material of which the semiconductor layer is formed.

A color filter layer and a microlens layer may be formed on the light shielding layer.

According to an embodiment of the present inventive concept, an image sensor is provided. The image sensor includes a first unit pixel, a second unit pixel, a first pixel isolation region, a light shielding layer, and a wiring layer. The first unit pixel includes a first light sensing region formed in a first portion in a semiconductor layer having a first surface and a second surface opposite to the first surface. The second unit pixel includes a second light sensing region formed in a second portion of the semiconductor layer. The second light sensing region abuts on the first portion in the semiconductor layer. The first pixel isolation region includes a first pixel isolation layer that is buried in a first isolation trench formed between the first and second surfaces of the semiconductor layer. The first pixel isolation layer isolates the first and second unit pixels from each other. The light shielding layer is disposed on the first unit pixel or the second unit pixel. The light shielding layer shields light incident through the second surface. The wiring layer is formed on the first surface of the semiconductor layer.

The first isolation trench may be formed in a first direction extending from the second surface to the first surface or in a second direction extending from the first surface to the second surface. The first isolation trench may abut on the first and second surfaces.

The first isolation trench may be formed in a first direction extending from the second surface to the first surface. The first isolation trench may be spaced apart from the first surface.

The first isolation trench may be formed in a second direction extending from the first surface to the second surface. The first isolation trench may be spaced apart from the second surface. A second isolation trench may be formed, in the semiconductor layer, in a first direction extending from the second surface to the first surface. A second pixel isolation layer may be formed in the second isolation trench. The second isolation trench may abut on the first isolation trench.

An insulation layer may be formed on the second surface of the semiconductor layer, and the light shielding layer may be formed in the insulation layer.

According to an embodiment of the present inventive concept, an image sensor is provided. The image sensor includes a first unit pixel, a second unit pixel, a first pixel isolation region, and a wiring layer. The first unit pixel includes a first light sensing region and a light shielding layer. The first light sensing region is formed in a first portion of a semiconductor layer having a first surface and a second surface opposite to the first surface. The light shielding layer is disposed on the first light sensing region. The second unit pixel is formed in a second portion of the semiconductor layer. The second unit pixel abuts on the first portion in the semiconductor layer. The first pixel isolation region is buried in a first isolation trench formed between the first and second surfaces of the semiconductor layer. The first pixel isolation region isolates the first unit pixel and the second unit pixel. The wiring layer is formed on the first surface of the semiconductor layer.

The first isolation trench may be an isolation trench formed in a first direction extending from the second surface to the first surface or in a second direction extending from the first surface to the second surface, an isolation trench formed in the first direction and spaced apart from the first surface, or an isolation trench formed in the second direction and spaced apart from the second surface.

An insulation layer may be formed on the second surface of the semiconductor layer, and the light shielding layer may be formed in the insulation layer.

According to an embodiment of the present inventive concept, a method of manufacturing an image sensor is provided. The method includes providing a semiconductor layer having a first surface and a second surface opposite to the first surface, forming an isolation trench by etching the semiconductor layer in a first direction from the second surface to the first surface or in a second direction from the first surface to the second surface, forming a pixel isolation layer buried in the isolation trench, forming a first light sensing region and a second light sending device isolated from each other by the pixel isolation layer, forming a wiring layer on the first surface of the semiconductor layer, and forming a light shielding layer on the first light sensing region or the second light sensing region of the semiconductor layer. The first and second light sensing regions are formed from the first surface of the semiconductor layer.

The forming of a pixel isolation layer may include forming a mask pattern on the second surface of the semiconductor layer, forming the isolation trench by etching the semiconductor layer in the first direction extending from the second surface to the first surface by using the mask pattern as an etching mask, and forming the pixel isolation layer by forming an insulation material layer buried in the isolation trench.

A portion of an entire thickness of the semiconductor layer may be etched when the isolation trench is formed.

The forming of a pixel isolation layer may include forming a mask pattern on the first surface of the semiconductor layer, forming the isolation trench by etching the semiconductor layer in the second direction extending from the first surface to the second surface by using the mask pattern as an etching mask, and forming the pixel isolation layer by forming an insulation material layer buried in the isolation trench.

The method may further include, after forming the pixel isolation layer, grinding the second surface of the semiconductor layer.

A portion of an entire thickness of the semiconductor layer may be etched when the isolation trench is formed.

The method may further include forming a color filter layer on the second surface of the semiconductor layer and forming a microlens layer on the color filter layer.

According to an embodiment of the present inventive concept, an image sensor is provided. The image sensor includes a pixel array region and a logic region. The pixel array region includes a first unit pixel, a second unit pixel, and a first pixel isolation region. The first pixel isolation region is disposed between the first unit pixel and the second unit pixel. The logic region is disposed around edges of the pixel array region. The logic region provides driving signals to the first unit pixel and the second unit pixel. The first unit pixel includes a first light sensing region formed in a first portion in a semiconductor layer having a first surface and a second surface opposite to the first surface. The second unit pixel includes a second light sensing region formed in a second portion of the semiconductor layer. The first pixel isolation region includes a first pixel isolation layer isolating the first and second unit pixels from each other.

The image sensor may further include a light shielding layer formed on the first light sensing region or the second light sensing region.

The image sensor may further include a wiring layer formed on the first surface of the semiconductor layer.

The logic region may include a row driver, a correlated double sampler, and an analog-to-digital converter. The row driver may provide the driving signals to the first and second unit pixels. The correlated double sampler may receive an output signal from the first and second unit pixels and may output a first value corresponding to a difference between a reference noise level and a level of the output signal from the first and second unit pixels. The analog-to-digital converter may convert an analog signal corresponding to the first value to a digital signal and may output the converted digital signal.

A color filter layer and a microlens layer may be formed on the light shielding layer.

BRIEF DESCRIPTION OF THE DRAWINGS

Exemplary embodiments of the present inventive concept will be more clearly understood from the following detailed description taken in conjunction with the accompanying drawings in which.

DETAILED DESCRIPTION OF THE EMBODIMENTS

Figure 1:
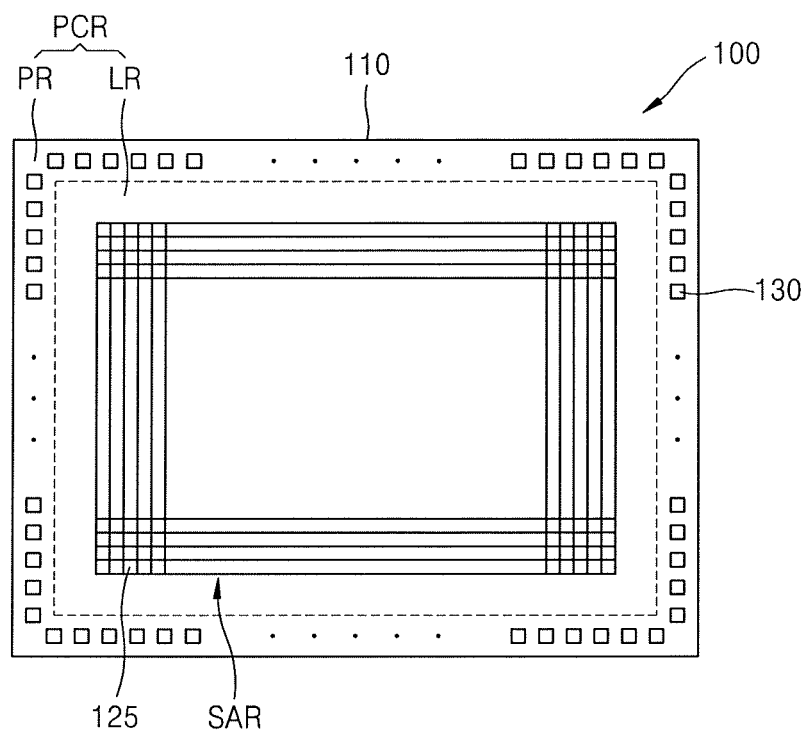
FIG. 1 is a plan view illustrating an image sensor according to an embodiment of the present inventive concept.

The present inventive concept will now be described more fully with reference to the accompanying drawings, in which exemplary embodiments thereof are shown. The present inventive concept may, however, be embodied in many different forms, and should not be construed as being limited to the exemplary embodiments set forth herein. Like reference numerals may refer to like elements in the drawings and specification. In the drawings, the dimension of structures may be exaggerated for clarity. As used herein, the term "and/or" includes any and all combinations of one or more of the associated listed items.

In the present specification, when a constituent element such as a film, a layer, a region, or a substrate is "on" or "connected" or "coupled" to another constituent element, it may be construed that the constituent element is on or connected or coupled to the other constituent element not only directly but also through at least one of other constituent elements interposed therebetween.

As used herein, the singular forms "a," "an" and "the" are intended to include the plural forms as well, unless the context clearly indicates otherwise.

FIG. 1 is a plan view illustrating an image sensor 100 according to an embodiment of the present inventive concept.

Referring to FIG. 1, the image sensor 100 may include a pixel array region SAR (or a sensor array region), a logic region LR, and a pad region PR which are formed on a semiconductor substrate 110.

The semiconductor substrate 110 may include, for example, silicon (Si). In an embodiment of the present inventive concept, the semiconductor substrate 110 may include a semiconductor element such as germanium (Ge), or the like, a compound semiconductor such as (SiC), gallium arsenide (GaAs), indium arsenide (InAs), indium phosphide (InP), or the like.

The semiconductor substrate 110 may include a silicon on insulator (SOI) structure or a buried oxide (BOX) layer. The semiconductor substrate 110 may include a conductive region, for example, an impurity-doped well or an impurity-doped structure. The image sensor 100 may be, for example, a complementary metal-oxide-semiconductor (CMOS) image sensor (CIS).

The pixel array region SAR includes a plurality of unit pixels 125 arranged in a matrix. The logic region LR may be disposed along edges of the pixel array region SAR. While the logic region LR is illustrated in FIG. 1 as being placed along four edges of the pixel array region SAR, the logic region LR may be placed along two or three edges of the pixel array region SAR in an embodiment of the present inventive concept.

The logic region LR is formed of electronic devices including a plurality of transistors. The logic region LR provides each unit pixel 125 of the pixel array region SAR with a predetermined signal or controls an output signal of each unit pixel 125. The logic region LR may include, for example, a timing generator, a row decoder, a row driver, a correlated double sampler (CDS), an analog-to-digital converter (ADC), a latch unit, a column decoder or the like.

The plurality of unit pixels 125 of the pixel array region SAR may be driven by receiving a plurality of driving signals such as a row selection signal, a reset signal, or a charge transmission signal from the row driver. In addition, an electrical output signal obtained by photoelectric conversion in the plurality of unit pixels 125 may be provided to the CDS. The timing generator may provide the row decoder and the column decoder with a timing signal and a control signal.

The row driver provides the plurality of driving signals to drive the unit pixels 125 according to a result of decoding performed in the row decoder, and if the unit pixels 125 are arranged in a matrix, the row driver may provide a driving signal to each row of the unit pixels 125. The CDS may receive an output signal from the unit pixels 125, and maintain and sample the received output signal. For example, the CDS may sample a predetermined noise level and a signal level from the output signal from the unit pixels 125 to output a value corresponding to a difference between the predetermined noise level and the signal level which are sampled.

The ADC may convert an analog signal corresponding to the difference between the predetermined noise level and the signal level to a digital signal, and output the converted digital signal. The latch unit may latch the digital signal, and the latched signal may be sequentially output according to a result of decoding performed in the column decoder.

The unit pixels 125 may be, for example, a passive pixel sensor or an active pixel sensor. The unit pixels 125 may be, for example, a light sensing region (e.g., a photodiode) that senses light, a transfer transistor that transfers charges generated by the light sensing region, a reset transistor that periodically resets a floating diffusion region in which the transferred charges are stored, a source follower that buffers a signal according to the charges in the floating diffusion region, or the like.

The pad region PR includes a plurality of pads 130 used to transmit or receive an electrical signal to or from an external device or a package base substrate. The pad region PR is disposed around the pixel array region SAR. The plurality of pads 130 formed in the pad region PR are electrically connected to the pixel units 125 and are disposed around the pixel array region SAR. The plurality of pads 130 may be, for example, a metal, a metal nitride, a combination of the metal and the metal nitride, or the like. A conductive wiring and a conductive plug, which electrically connect the plurality of pads 130 to electronic devices in the logic region LR and the plurality of unit pixels 125 in the pixel array region SAR, are formed in the substrate 110. The conductive wiring and the conductive plug may be formed of, for example, a metal, a metal nitride, a combination of the metal and the metal nitride, or the like.

As contrasted with the pixel array region SAR, the logic region LR and the pad region PR may be referred to as a peripheral circuit region (PCR), and the peripheral circuit region PCR refers to a region of the semiconductor substrate 110 that forms the image sensor 100, except the pixel array region SAR.

Figure 2:
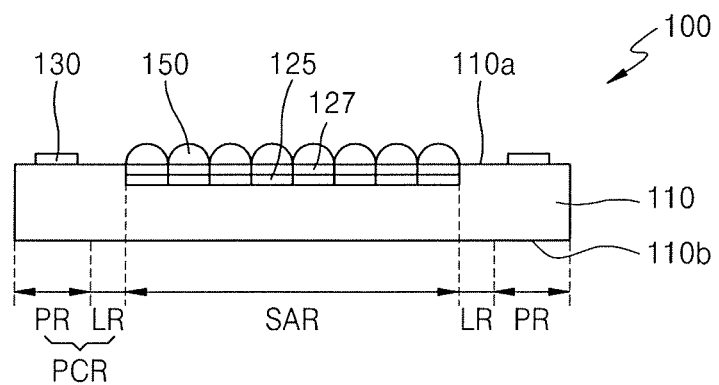
FIG. 2 is a cross-sectional view illustrating an image sensor according to an embodiment of the present inventive concept.

FIG. 2 is a cross-sectional view illustrating an image sensor 100 according to an embodiment of the present inventive concept.

Referring to FIG. 2, the image sensor 100 may include a pixel array region SAR (or a sensor array region), a logic region LR, and a pad region PR. The semiconductor substrate 110 has a first surface 110*a* and a second surface 110*b*. The first surface 110*a* may be a lower surface of the semiconductor substrate 110 and the second surface 110*b* may be an upper surface of the semiconductor substrate 110. In an embodiment of the present inventive concept, the first surface 110*a* may be an upper surface of the semiconductor substrate 110 and the second surface 110*b* may be a lower surface of the semiconductor substrate 110.

The pixel array region SAR may include a plurality of unit pixels 125 arranged in a matrix. The plurality of unit pixels 125 and a plurality of pads 130 may be formed on the first surface 110*a* of the semiconductor substrate 110. A plurality of color filter layers 127 and a plurality of microlens layers 150 are sequentially formed on the plurality of unit pixels 125.

The plurality of color filter layers 127 may include, for example, a red (R) filter, a blue (B) filter, and a green (G) filter. In an embodiment of the present inventive concept, the color filter layers 127 may include a cyan (C) filter, a yellow (Y) filter, and a magenta (M) filter. For example, a color filter 127, which is one of a R filter, a B filter, and a G filter, or a color filter 127, which is one of a C filter, a Y filter, and an M filter, may be formed on each unit pixel 125, and thus, each unit pixel 125 may sense a color by sensing a component of separated incident light.

The plurality of microlens layers 150 may condense incident light on the pixel array region SAR onto the unit pixels 125. When the unit pixels 125 each include a light sensing region (for example, a photodiode), the microlens layers 150 may condense the incident light on the pixel array region SAR onto the light sensing regions of the unit pixels 125.

Figure 3:
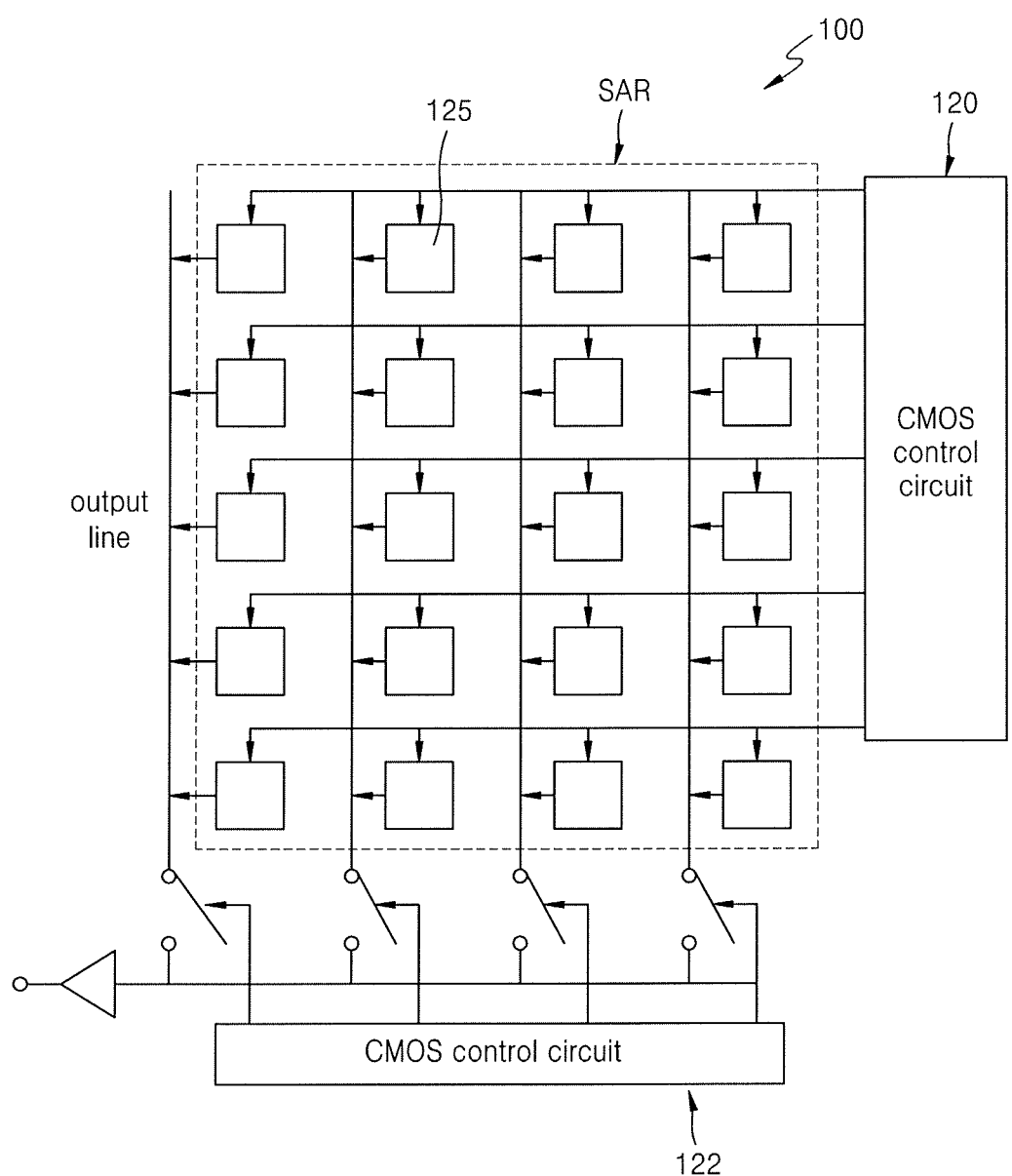
FIG. 3 is a block diagram illustrating an image sensor according to an embodiment of the present inventive concept.

FIG. 3 is a block diagram illustrating an image sensor 100 according to an embodiment of the present inventive concept.

Referring to FIG. 3, the image sensor 100 may include a pixel array region SAR and a CMOS control circuits 120 and 122. The pixel array region SAR may include a plurality of unit pixels 125 disposed in a matrix. The CMOS control circuits 120 and 122 disposed around the pixel array region SAR include a plurality of CMOS transistors and may provide a predetermined signal to the unit pixels 125 included in the pixel array region SAR or control an output signal of the unit pixels 125. For example, the CMOS control circuit 120 may include, for example, a row driver, and the CMOS control circuit 122 may include a CDS, a comparator, and an ADC. The unit pixels 125 may have various structures according to elements of a pixel. For example, the unit pixels 125 may have a structure including one to five transistors.

Figure 4:
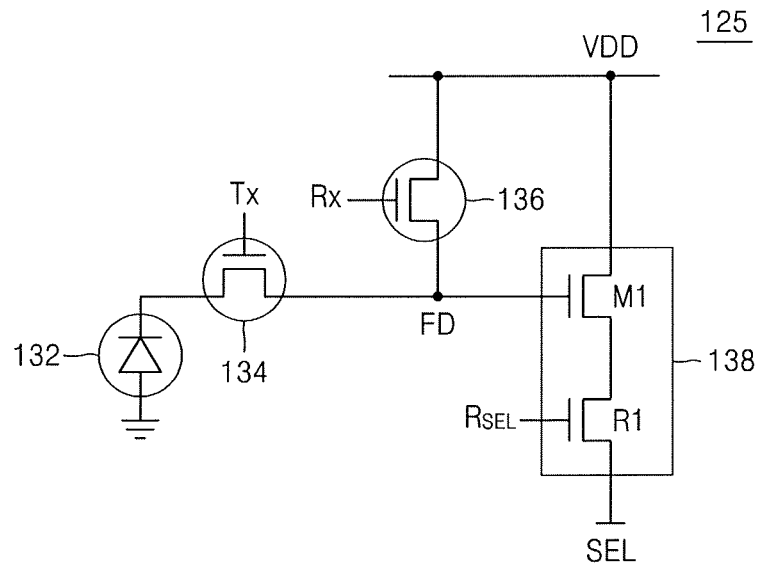
FIG. 4 is a circuit diagram illustrating a unit pixel according to an embodiment of the present inventive concept.
Figure 5:
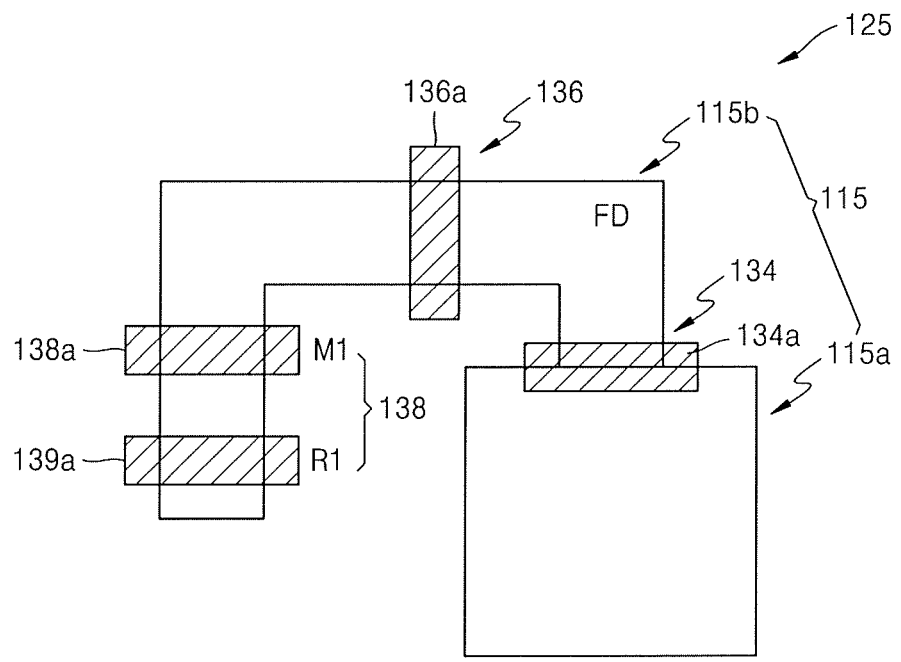
FIG. 5 is a plan view illustrating the unit pixel of FIG. 2 implemented on a semiconductor substrate according to an embodiment of the present inventive concept.

FIG. 4 is a circuit diagram illustrating a unit pixel 125 according to an embodiment of the present inventive concept, and FIG. 5 is a plan view illustrating the unit pixel 125 of FIG. 2 implemented on a semiconductor substrate according to an embodiment of the present inventive concept.

Referring to FIG. 4, the unit pixel 125 includes a photodiode 132 that senses light, a transfer transistor Tx 134 that transfers charges generated by the photodiode 132, a reset transistor Rx 136 that periodically resets a floating diffusion region FD in which the transferred charges are stored, and a source follower 138 that buffers a signal according to the charges charged in the floating diffusion region FD.

The source follower 138 may include two metal-oxide-semiconductor field-effect transistors (MOSFET) M1 and R1 that are serially connected. An end of the reset transistor 136 and an end of the MOSFET transistor M1 are connected to a power voltage VDD, and a gate electrode of the MOSFET transistor R1 is connected to a row selection signal line RSEL, and an end of the MOSFET transistor R1 is connected to a column selection line SEL.

The unit pixel 125 is integrated to the semiconductor substrate as illustrated in FIG. 5. For example, an active region 115 is formed on the semiconductor substrate. The active region 115 includes a photodiode region 115*a* (e.g., a light sensing device region) and a transistor region 115*b*. The photodiode region 115*a* may have, for example, a rectangular plate shape to occupy a predetermined portion, which is defined as a unit pixel, of the semiconductor substrate.

The transistor region 115*b* may abut on a surface of the photodiode region 115*a* and have at least one curved line portion. The transistor region 115*b* includes a gate electrode 134*a* of the transfer transistor 134, a gate electrode 136*a* of the reset transistor 136, and gate electrodes 138*a* and 139*a* of the source follower 138.

The image sensor 100 having the above-described structure and circuits may be mounted to an image photographing apparatus such as a camera, a camcorder, or the like to obtain an image of an object, and the image sensor 100 may be used as an autofocus sensor. Hereinafter, an autofocusing method used in the image photographing apparatus such as a camera, a camcorder, or the like will be described.

The autofocusing method in the image photographing apparatus may include a method based on an active system (hereinafter, referred to as "an active method" and a method based on a passive system (hereinafter, referred to as "a passive method".

The active method is referred to as 'active' in that the image measuring apparatus such as a camera emits an ultrasound wave or an infrared ray to obtain an autofocus. The active method may include measuring a distance between the image photographing apparatus (e.g., a camera) and an object by emitting an ultrasound wave or an infrared ray from the image measuring apparatus and adjusting a focus of an optical system included in the image photographing apparatus.

When an ultrasound wave is used to measure a distance between the image photographing apparatus and an object in the active method, a first time during when the ultrasound wave emitted from an ultrasound wave generating apparatus is transmitted and reflected to and from the object is measured, and thus, the distance between the image photographing apparatus and the object is calculated based on the first time. For example, when an infrared ray is used to measure a distance between the image photographing apparatus and an object in the active method, trigonometry, measurement of an intensity of an infrared ray reflected by an object, or measurement of time of an infrared ray reflected by an object may be used. In the active method, if there is a window between the image photographing apparatus such as a camera and the object, glass of the window may reflect an ultrasound wave or an infrared ray, and thus a focus may not be adjusted.

According to the passive method, a focus may be adjusted even if a window is disposed between an image photographing apparatus such as a camera and the object. For example, in the passive method, a focus is adjusted by using light that is naturally reflected by the object. The passive method may include a phase detection method (e.g., a phase difference detection method or a phase comparison method) and a contrast detection method.

In the phase detection method, incident light from the object is divided into two lights and the two lights are compared with each other to determine whether the light is focused. In the contrast detection method, a contrast of an image is continuously calculated while moving a lens, and it is determined that a focus is adjusted when the contrast is maximum. The image sensor according an embodiment of the present inventive concept may use the phase detection method.

Figure 6:
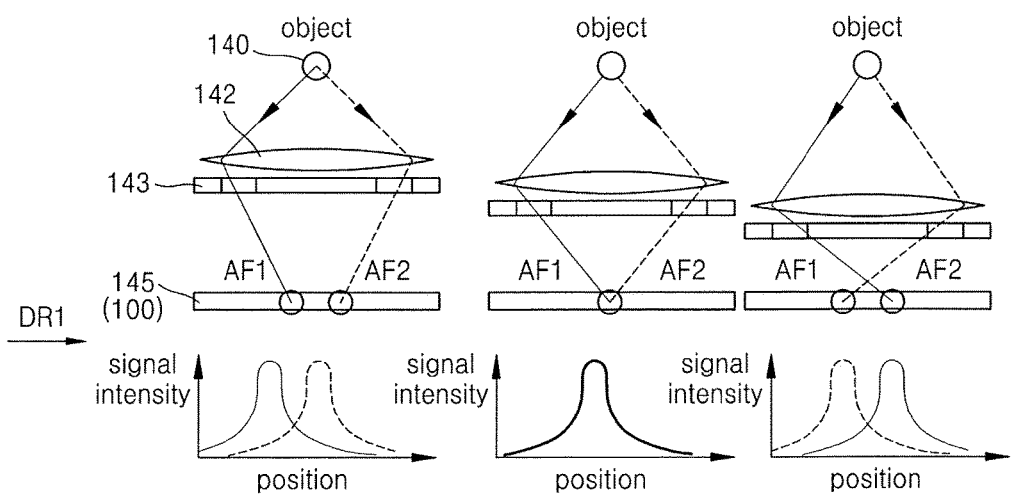
FIGS. 6 through 8 are diagrams for explaining a phase detection method used in an image sensor according to an embodiment of the present inventive concept.
Figure 7:
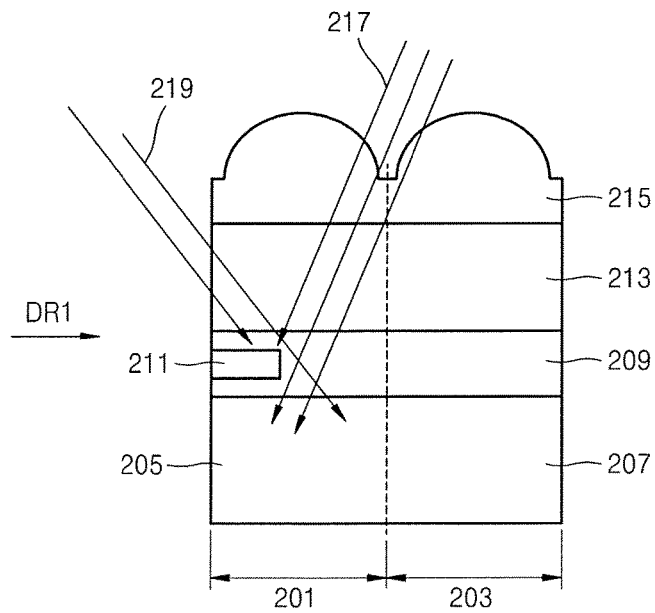
Figure 8:
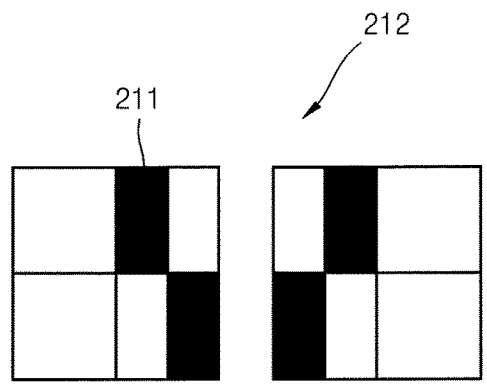

FIGS. 6 through 8 are diagrams for explaining a phase detection method used in an image sensor according to an embodiment of the present inventive concept.

Referring to FIG. 6, according to the phase detection method, incident light from an object 140 passes through a lens 142 and an optical filter 143 to form an autofocus on the light sensing region 145 of the image sensor 100. The light incident from the object 140 is divided into a first light AF1 and a second light AF2.

As illustrated in a left view of FIG. 6, the first light AF1 and the second light AF2 incident from the object 140 have different signal intensities from each other according to a position of the light sensing region 145 in a direction DR1, and thus, an autofocus may be formed when the lens 142 is moved backward. As illustrated in a right view of FIG. 6, the first light AF1 and the second light AF2 incident from the object 140 have different signal intensities according to a position of the light sensing region 145, and thus, an autofocus may be formed when the lens 142 is moved forward.

As illustrated in a middle view of FIG. 6, the first light AF1 and the second light AF2 incident from the object 140 have identical signal intensities according to a position of the light sensing region 145, and thus, an autofocus may be formed on the light sensing region 145 without moving the lens 142.

Referring to FIGS. 7 and 8, in the image sensor 100 according to an embodiment of the present inventive concept, a light shielding layer 211 is formed on one of unit pixels 201 and 203. Accordingly, position information of the lens 142 may be obtained based on signal intensities according to a position of a light sensing region 205 (e.g., the light sensing region 145 of FIG. 6) and directions of light 217 and 218 that are incident at predetermined angles.

For example, as illustrated in FIG. 7, the light shielding layer 211 is formed on the first unit pixel 201 which is one of the unit pixels 201 and 203. Signal intensities of light 219 that is incident from the left with respect to the light shielding layer 211 and signal intensities of light 217 that is incident from the right with respect to the light shielding layer 211 are compared with each other according to a position of the light sensing region 205 (e.g., the light sensing region 145 of FIG. 6) in the direction DR1. Accordingly, the position information of the lens 142 may be obtained and thus, an autofocus may be formed on the light sensing region 205.

In FIG. 7, a light sensing region 207 may be formed in the unit pixel 203, and an insulation layer 209, a color filter layer 213, and a microlens layer 215 may be included in, for example, the unit pixel 203. In an embodiment of the present inventive concept, if the lens 142 described above with reference to FIG. 6 is not included in, for example, the unit pixel 203, the microlens layer 215 may be used as the lens 142.

The light shielding layer 211 described above with reference to FIG. 7 may be formed of a metal layer. The light shielding layer 211 (e.g., light shielding pattern) in a light shielding level 212 may be formed in some of unit pixels (e.g., 201 or 203) in a plan view of FIG. 8. For example, the unit pixel 201 of FIG. 7 may be referred to as a phase detection autofocusing pixel, and the unit pixel 203 may be referred to as a general pixel from which image information may be obtained.

As described above, in the phase detection method, whether light is focused is determined by dividing light incident from an object into two lights and then comparing the two lights with each other. The phase detection method is performed according to a similar principle to that of manually adjusting a focus by using a split image screen. Using the phase detection method, an amount and a direction of moving a lens 142 are calculated to adjust a focus. Autofocusing in the phase detection method may be performed faster than that in the contrast detection method. This is because, in the contrast detection method, an amount and a direction of moving a lens 142 are not known in advance and thus, an image may be continuously analyzed while moving the lens 142.

When the phase detection method is used in an image photographing apparatus such as a compact digital camera having a small size of an image sensor, accuracy of autofocusing may be lowered due to interference between adjacent unit pixels. Hereinafter, an image sensor according to an embodiment of the present inventive concept, in which a phase detection method and a light shielding layer are used to increase accuracy of autofocusing, will be described.

Figure 9:
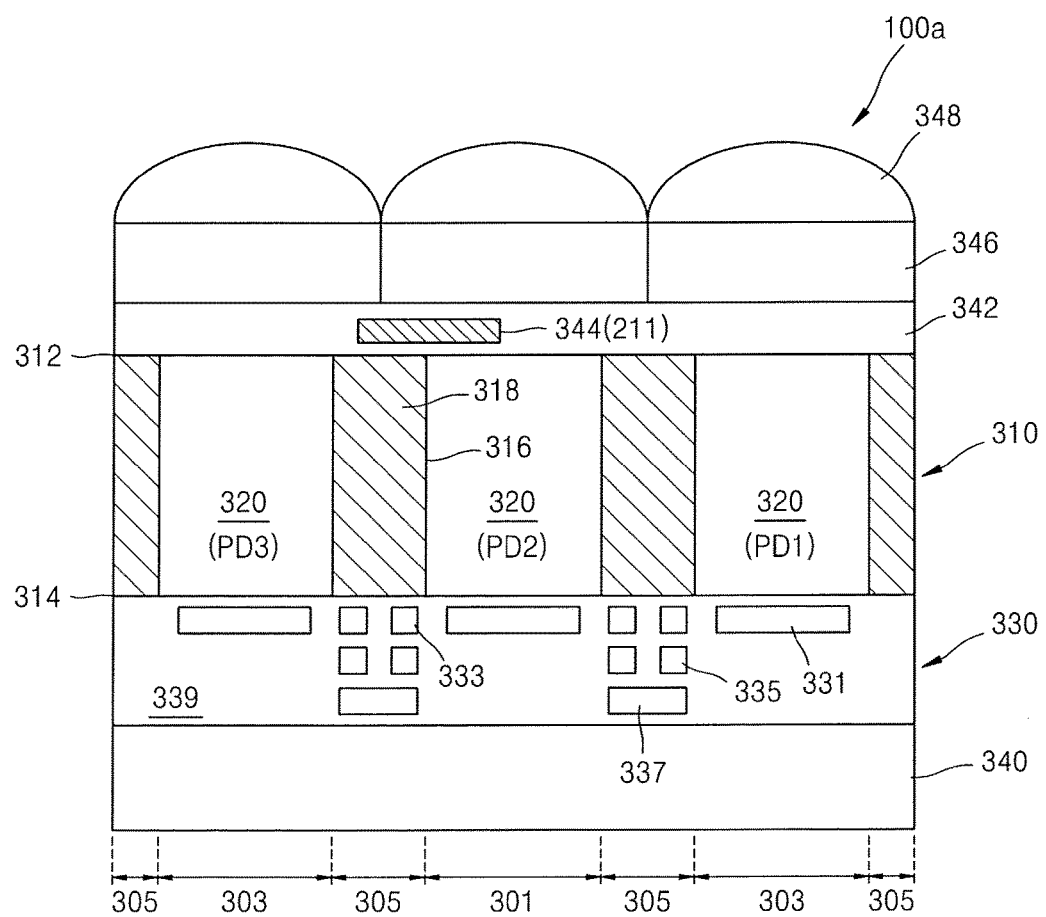
FIG. 9 is a cross-sectional view illustrating an image sensor according to an embodiment of the present inventive concept, in which a phase detection method is used.

FIG. 9 is a cross-sectional view illustrating an image sensor 100a according to an embodiment of the present inventive concept, in which a phase detection method is used.

Referring to FIG. 9, the image sensor 100a may include a semiconductor layer 310, a wiring layer 330, a carrier substrate 340, an insulation layer 342, a light shielding layer 344 (e.g., the light shielding layer 211 of FIGS. 7 and 8), a color filter layer 346, and a microlens layer 348. The carrier substrate 340 may be a silicon substrate. The image sensor 100a may be similar to the image sensor 100 described above. Thus, duplicate descriptions of the image sensor 100a in FIG. 9 with the image sensor 100 of FIGS. 1 through 8 will be omitted or briefly described.

The semiconductor layer 310 may have a first surface 314 and a second surface 312 opposite to the first surface 314. The semiconductor layer 310 may include a silicon substrate, and the first surface 314 may be a front surface of the silicon substrate and the second surface 312 may be a rear surface of the silicon substrate. The semiconductor layer 310 may be an epitaxial layer formed on the silicon substrate. The semiconductor layer 310 may be a silicon layer.

A plurality of light sensing regions 320 may be formed in the semiconductor layer 310. The light sensing regions 320 may generate photoelectrons in response to light that is incident from the outside. The light sensing regions 320 may be named as PD1, PD2, and PD3, as illustrated in FIG. 9. The light sensing regions 320 may be formed of a photodiode, a phototransistor, a photogate, a pinned photodiode, or the like.

A pixel isolation layer 318 is formed between adjacent light sensing regions 320. The light sensing regions 320 may be formed in the entire regions of the semiconductor layer 310 that are separated by using the pixel isolation layer 318.

The pixel isolation layer 318 is buried in an isolation trench 316 formed between the first surface 314 and the second surface 312. The pixel isolation layer 318 may be an isolation material layer (e.g., an oxide) which is buried in the isolation trench 316. The pixel isolation layer 318 may be formed of a material having a lower refractive index than a material of which the semiconductor layer 310 is formed.

The isolation trench 316 may be formed in a direction extending (e.g., extending perpendicularly) from the second surface 312 to the first surface 314 or in a direction extending (e.g., extending perpendicularly) from the first surface 314 to the second surface 312. The isolation trench 316 may be perpendicularly formed between the second surface 312 and the first surface 314. The isolation trench 316 may be a through-type isolation trench that is perpendicularly formed between the second surface 312 and the first surface 314, and the pixel isolation layer 318 may be an insulation material layer buried in the through-type isolation trench.

The isolation trench 316 is formed at a deep depth between the first surface 314 and the second surface 312 and thus may be referred to as a "deep trench". By forming the pixel isolation layer 318 as a deep trench, optical crosstalk and electrical crosstalk may be reduced.

The optical crosstalk may be a phenomenon where incident light passing through the color filter layer 346 is transmitted to adjacent light sensing regions 320, and the electrical crosstalk may be a phenomenon where electron hole pairs generated in a depletion region of a light sensing region 320 are transmitted to another adjacent light sensing regions 320.

The wiring layer 330 is formed on the first surface 314 of the semiconductor layer 310. The wiring layer 330 may include an intermetallic insulation layer 339 and metal wirings 331, 333, 335, and 337. The intermetallic insulation layer 339 may be formed of an oxide layer, a composite layer formed of an oxide layer and a nitride layer, or the like. The oxide layer may be a silicon oxide layer.

The metal wirings 331, 333, 335, and 337 may include an electrical wiring used for sensing operations of the transistors described above or the light sensing regions 320 in the semiconductor layer 310. The metal wirings 331, 333, 335, and 337 may be divided into first metal wirings 331 and 333, a second metal wiring 335, and a third metal wiring 337 according to an order in which the wirings are formed on the semiconductor layer 310. The first metal wirings 331 and 333 may be a gate or a word line level, and the second metal wiring 335 and the third metal wiring 337 may be a bit line level.

The metal wirings 331, 333, 335, and 337 may be used to reflect light that is incident through the light sensing regions 320 to the light sensing regions 320 again. The metal wirings 331, 333, 335, and 337 may be copper, titanium, titanium nitride, or the like.

The light shielding layer 344 (e.g., the light shielding layer 211 of FIGS. 7 and 8) may be formed on the second surface 312 of the semiconductor layer 310. The light shielding layer 344 may be formed inside the insulation layer 342 on the second surface 312 of the semiconductor layer 310. The light shielding layer 344 is formed on some of the light sensing regions 320. The light shielding layer 344 may be formed on the pixel isolation layer 318 and some of the light sensing regions 320 (e.g., PD2).

In addition, the color filter layer 346 (e.g., the color filter layer 127 of FIG. 2) and the microlens layer 348 (e.g., the microlens layer 150 of FIG. 2) are formed on the second surface 312 of the semiconductor layer 310 and the light shielding layer 344 (e.g., the light shielding layer 211 of FIGS. 7 and 8). The color filter layer 346 passes through visible-range wavelengths. For example, the color filter layer 346 may be a red filter, a green filter or a blue filter according to each unit pixel. The red filter may pass through red-range wavelengths among the visible-range wavelengths. The green filter may pass through green-range wavelengths among the visible-range wavelengths. The blue filter may pass through blue-range wavelengths among the visible-range wavelengths.

In an embodiment of the present inventive concept, the color filter layer 346 may be a cyan filter, a magenta filter, or a yellow filter. The cyan filter may pass through wavelengths in a range from 450 nm to 550 nm among the visible-range wavelengths. The magenta filter may pass through wavelengths in a range from 400 nm to 480 nm among the visible-range wavelengths. The yellow filter may pass through wavelengths in a range from 500 nm to 600 nm among the visible-range wavelengths. The microlens layer 348 may condense light incident from the outside. In an embodiment of the present inventive concept, the image sensor 100a may be implemented without the microlens layer 348.

The image sensor 100a having the above-described structure may obtain an autofocus by using a phase detection method using the light shielding layer 344, and accuracy of the autofocus may be increased by forming the pixel isolation layer 318 to separate the unit pixels 301 and 303 from one another to reduce crosstalk (e.g., optical crosstalk or electrical crosstalk) between the unit pixels 301 and 303.

For example, the unit pixels 301 and 303 may include a phase detection autofocusing pixel 301 and a general pixel 303 from which image information may be obtained. The phase detection autofocusing pixel 301 and the general pixel 303 may be separated by a pixel isolation region 305.

The phase detection autofocusing pixel 301 may include a first light sensing region PD2 (320) formed in a first portion in the semiconductor layer 310 and the light shielding layer 344 (211) disposed on the first light sensing region PD2 (320). The general pixels 303 may respectively include second light sensing regions PD1 and PD3 (320) that is formed in second portions of the semiconductor layer 310. For example, each of second light sensing regions PD1 and PD3 (320) may abut on the first portion in the semiconductor layer 310. The pixel isolation region 305 may include the pixel isolation layer 318 that is buried in the isolation trench 316 formed between the first surface 314 and the second surface 312 to separate the phase detection autofocusing pixel 301 and the general pixel 303.

Figure 10:
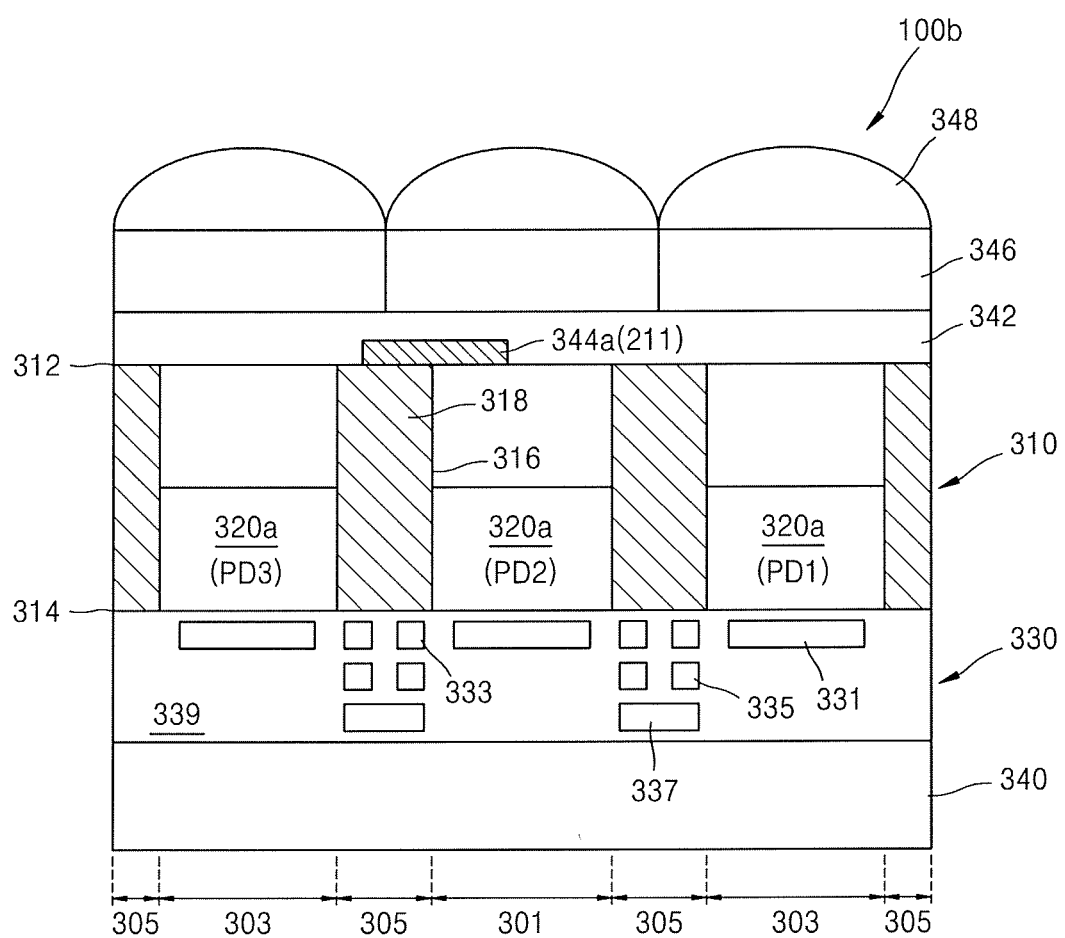
FIG. 10 is a cross-sectional view illustrating an image sensor according to an embodiment of the present inventive concept, in which a phase detection method is used.

FIG. 10 is a cross-sectional view illustrating an image sensor 100b according to an embodiment of the present inventive concept, in which a phase detection method is used.

Referring to FIG. 10, the image sensor 100b may have substantially the same structure as that of the image sensor 100a illustrated in FIG. 9 except for a light shielding layer 344a (e.g., the light shielding layer 211 of FIGS. 7 and 8) and light sensing regions 320a. Thus, for convenience of description, duplicate description of the image sensor 100b in FIG. 10 with the image sensor 100a in FIG. 9 will be omitted or briefly described.

A pixel isolation layer 318 is formed between adjacent light sensing regions 320a in the image sensor 100b. The light sensing regions 320a may be formed in a portion of the semiconductor layer 310 separated by the pixel isolation layer 318 according to necessity. For example, the light sensing regions 320a may be formed at a predetermined depth from the first surface 314 of the semiconductor layer 310.

In the image sensor 100b, the light shielding layer 344a may be formed on the second surface 312 of the semiconductor layer 310. In an embodiment of the present inventive concept, the light shielding layer 344 might not be formed inside the insulation layer 342 and may be directly formed on the second surface 312 of the semiconductor layer 310.

Figure 11:
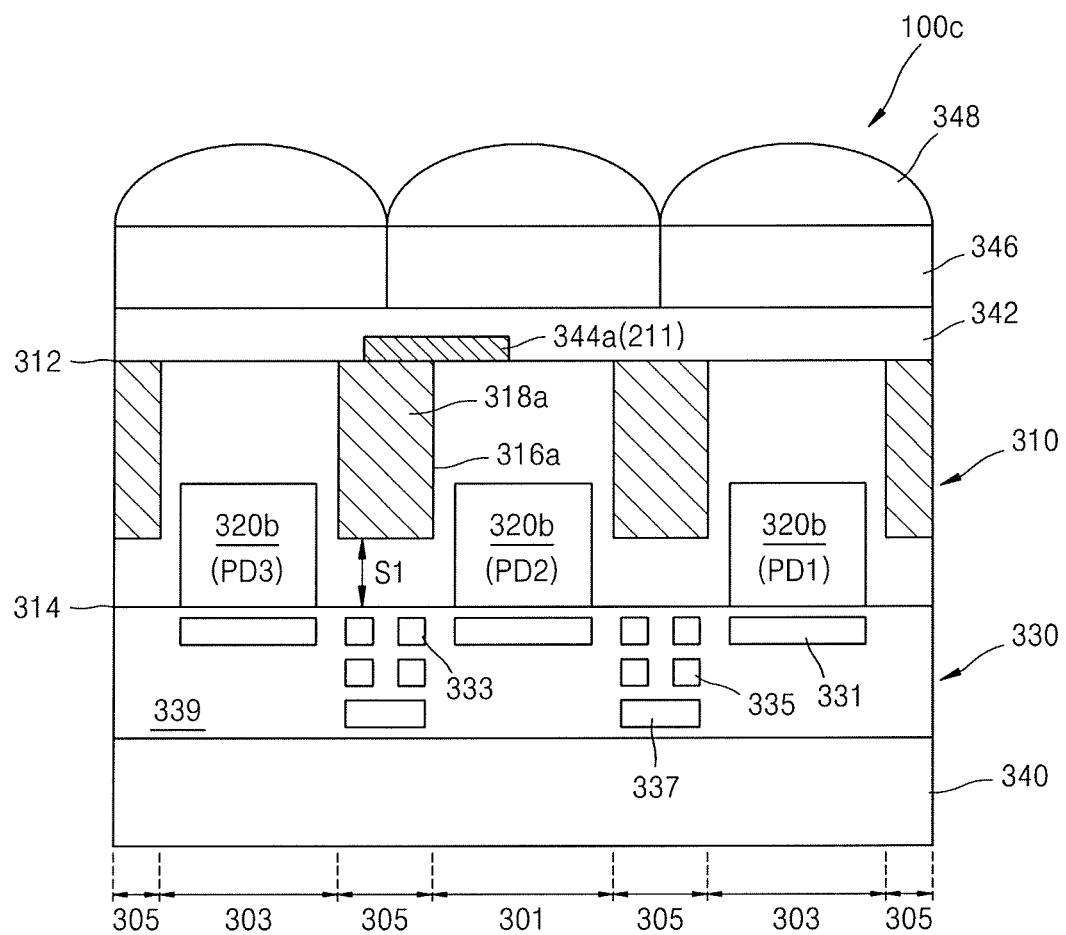
FIG. 11 is a cross-sectional view illustrating an image sensor according to an embodiment of the present inventive concept, in which a phase detection method is used.

FIG. 11 is a cross-sectional view illustrating an image sensor 100c according to an embodiment of the present inventive concept, in which a phase detection method is used.

Referring to FIG. 11, the image sensor 100c may have substantially the same structure as that of the image sensor 100a illustrated in FIG. 9 except for light sensing regions 320b and a pixel isolation layer 318a. Thus, for convenience of description, duplicate description of the image sensor 100c in FIG. 11 with the image sensor 100b in FIG. 10 will be omitted or briefly described.

The pixel isolation layer 318a is formed between adjacent light sensing regions 320b in the image sensor 100c. The light sensing regions 320b may be formed in a portion of the semiconductor layer 310 separated by the pixel isolation layer 318a. The light sensing regions 320b might not abut on the pixel isolation layer 318a, as illustrated in FIG. 11. For example, the light sensing regions 320b may be formed at a predetermined depth from the first surface 314 of the semiconductor layer 310 while not abutting on the pixel isolation layer 318a.

An isolation trench 316a of the image sensor 100c may be a first partial isolation trench that is formed in a direction extending (e.g., extending perpendicularly) from the second surface 312 to the first surface 314. The isolation trench 316a may be spaced apart from the first surface 314 by a distance S1. The pixel isolation layer 318a may be formed by burying an insulation material layer in the first partial isolation trench 316a.

Figure 12:
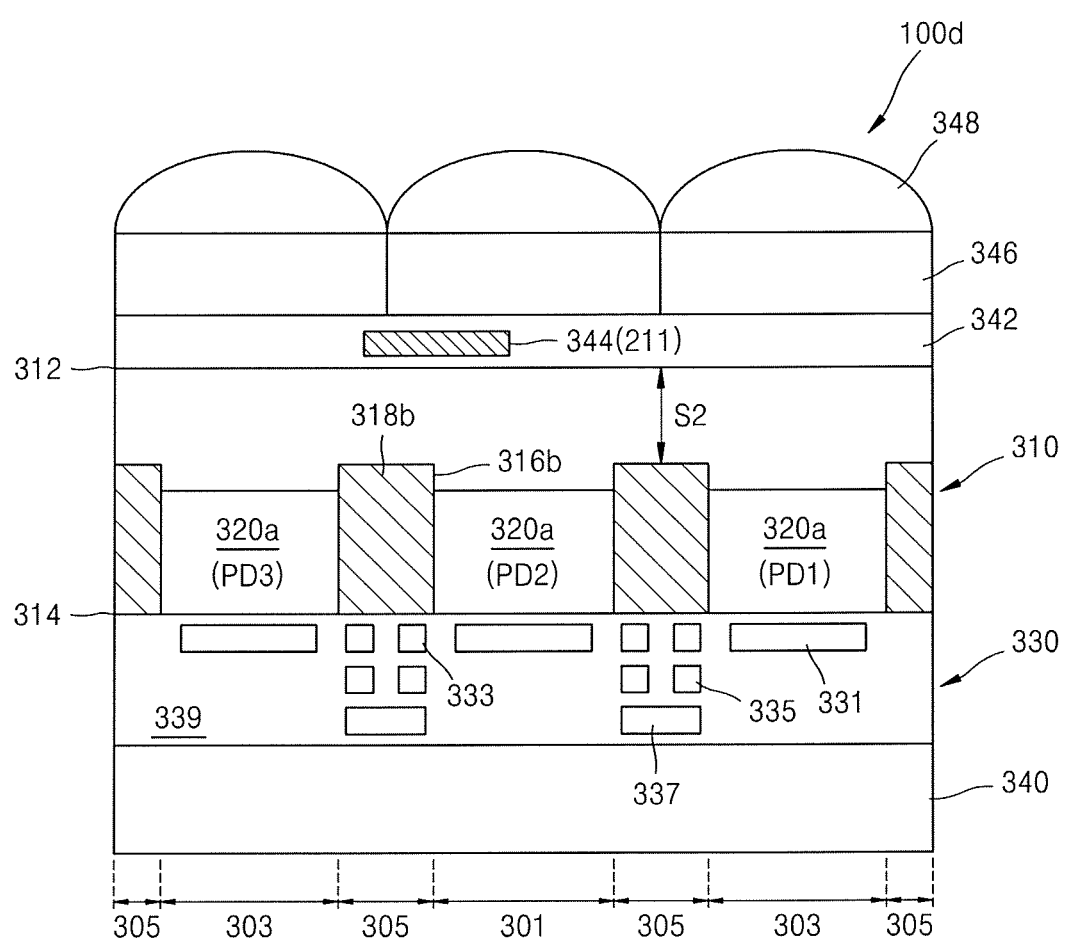
FIG. 12 is a cross-sectional view illustrating an image sensor according to an embodiment of the present inventive concept, in which a phase detection method is used.

FIG. 12 is a cross-sectional view illustrating an image sensor 100d according to an embodiment of the present inventive concept, in which a phase detection method is used.

Referring to FIG. 12, the image sensor 100d may have substantially the same structure as that of the image sensor 100a illustrated in FIG. 9 except for light sensing regions 320a and a pixel isolation layer 318b. Thus, for convenience of description, duplicate description of the image sensor 100d in FIG. 12 with the image sensor 100a in FIG. 9 will be omitted or briefly described.

The pixel isolation layer 318b is formed between adjacent light sensing regions 320a in the image sensor 100d. The light sensing regions 320a may be formed in a portion of the semiconductor layer 310 separated by the pixel isolation layer 318b. The light sensing regions 320a may abut on the pixel isolation layer 318b. For example, the light sensing regions 320a may be formed at a predetermined depth from the first surface 314 of the semiconductor layer 310 while abutting on the pixel isolation layer 318b.

An isolation trench 316b of the image sensor 100d may be a second partial isolation trench that is formed in a direction extending (e.g., extending perpendicularly) from the first surface 314 to the second surface 312. The isolation trench 316b may be spaced apart from the second surface 312 by a distance S2. The pixel isolation layer 318b may be formed by burying an insulation material layer in the second partial isolation trench 316b.

Figure 13:
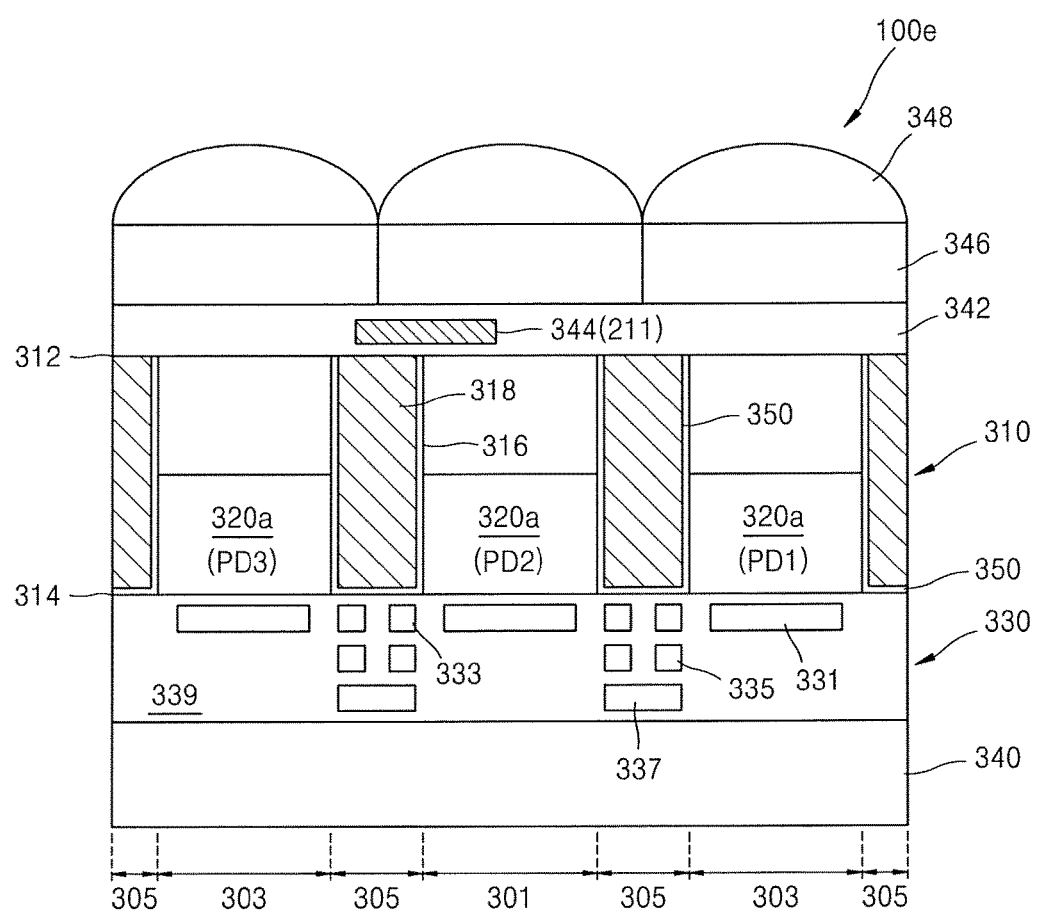
FIG. 13 is a cross-sectional view illustrating an image sensor according to an embodiment of the present inventive concept, in which a phase detection method is used.

FIG. 13 is a cross-sectional view illustrating an image sensor 100e according to an embodiment of the present inventive concept, in which a phase detection method is used.

Referring to FIG. 13, the image sensor 100e may have substantially the same structure as that of the image sensor 100a illustrated in FIG. 9 except for a liner layer 350 and light sensing regions 320a. Thus, for convenience of description, duplicate description of the image sensor 100e in FIG. 13 with the image sensor 100a in FIG. 9 will be omitted or briefly described.

The liner layer 350 may be formed on an inner wall of an isolation trench 316 in the image sensor 100e. The liner layer 350 may be formed to reinforce separation between the light sensing regions 320a. The liner layer 350 may be formed to protect a surface of the semiconductor layer 310 when the isolation trench 316 is formed. The liner layer 350 may be formed of a nitride layer, an impurity-doped material layer, or the like.

The light sensing regions 320a of the image sensor 100e may be formed in a portion of the semiconductor layer 310 separated by the pixel isolation layer 318. For example, the light sensing regions 320a may be formed at a predetermined depth from the first surface 314 of the semiconductor layer 310.

Figure 14:
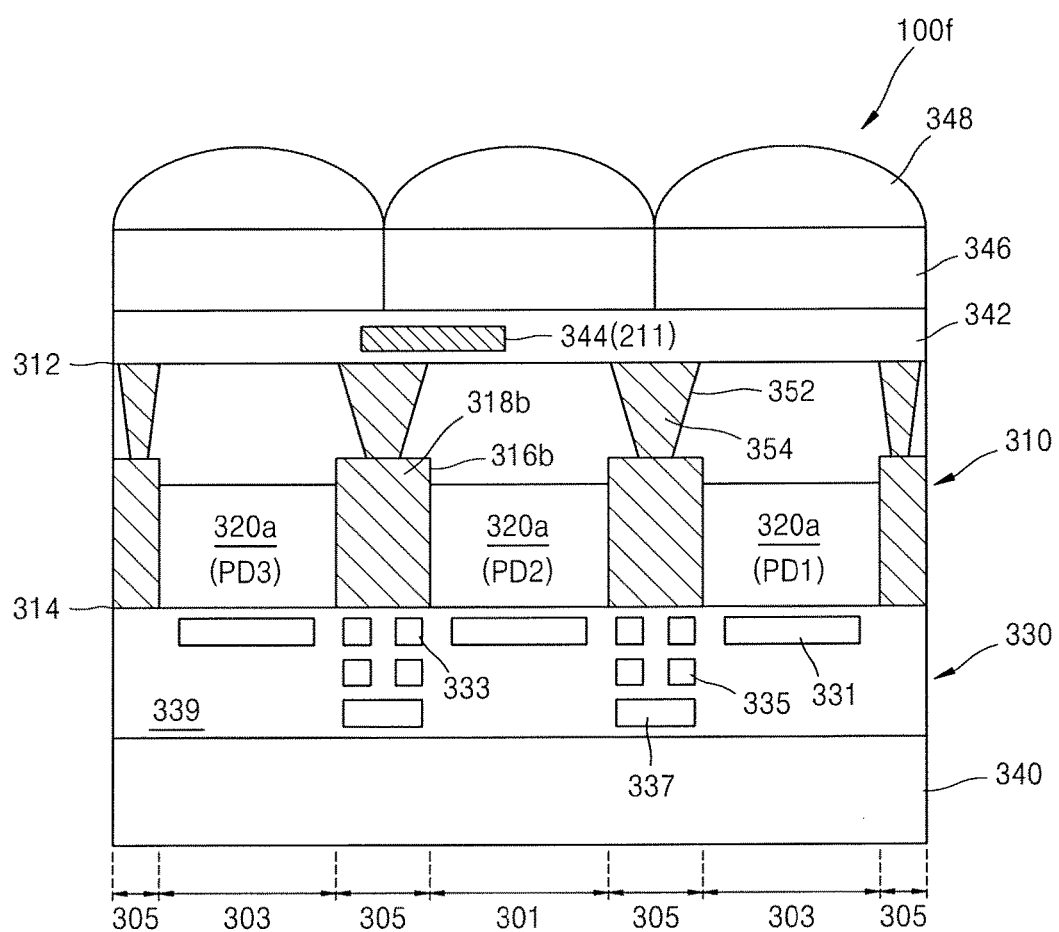
FIG. 14 is a cross-sectional view illustrating an image sensor according to an embodiment of the present inventive concept, in which a phase detection method is used.

FIG. 14 is a cross-sectional view illustrating an image sensor 100f according to an embodiment of the present inventive concept, in which a phase detection method is used.

Referring to FIG. 14, the image sensor 100f of FIG. 14 may have substantially the same structure as that of the image sensor 100d illustrated in FIG. 12 except for a second pixel isolation layer 354. Thus, for convenience of description, duplicate description of the image sensor 100f in FIG. 14 with the image sensor 100d in FIG. 12 will be omitted or briefly described.

A second partial isolation trench 316b may be formed in a direction extending (e.g., extending perpendicularly) from the first surface 314 to the second surface 312 and spaced apart from the second surface 312 as described with reference to FIG. 12. An insulation material layer may be buried in the pixel isolation layer 318b. The second partial isolation trench 316b and the pixel isolation layer 318b may be formed in the image sensor 100f.

In the image sensor 100f, a second partial trench 352 may be formed in a direction extending (e.g., extending perpendicularly) from the second surface 312 to the first surface 314. The second partial trench 352 may abut on the second partial isolation trench 316b. An insulation material layer is buried in the second partial trench 352 to form a second pixel isolation layer 354. For example, the second pixel isolation layer 354 may be formed by burying an insulation material layer in a shallow isolation trench (e.g., 352) which has a width decreased in a direction extending (e.g., extending perpendicularly) from the second surface 312 to the first surface 314. The image sensor 100f may separate the light sensing regions 320a securely by the pixel isolation layer 318b and the second pixel isolation layer 354.

Figure 15:
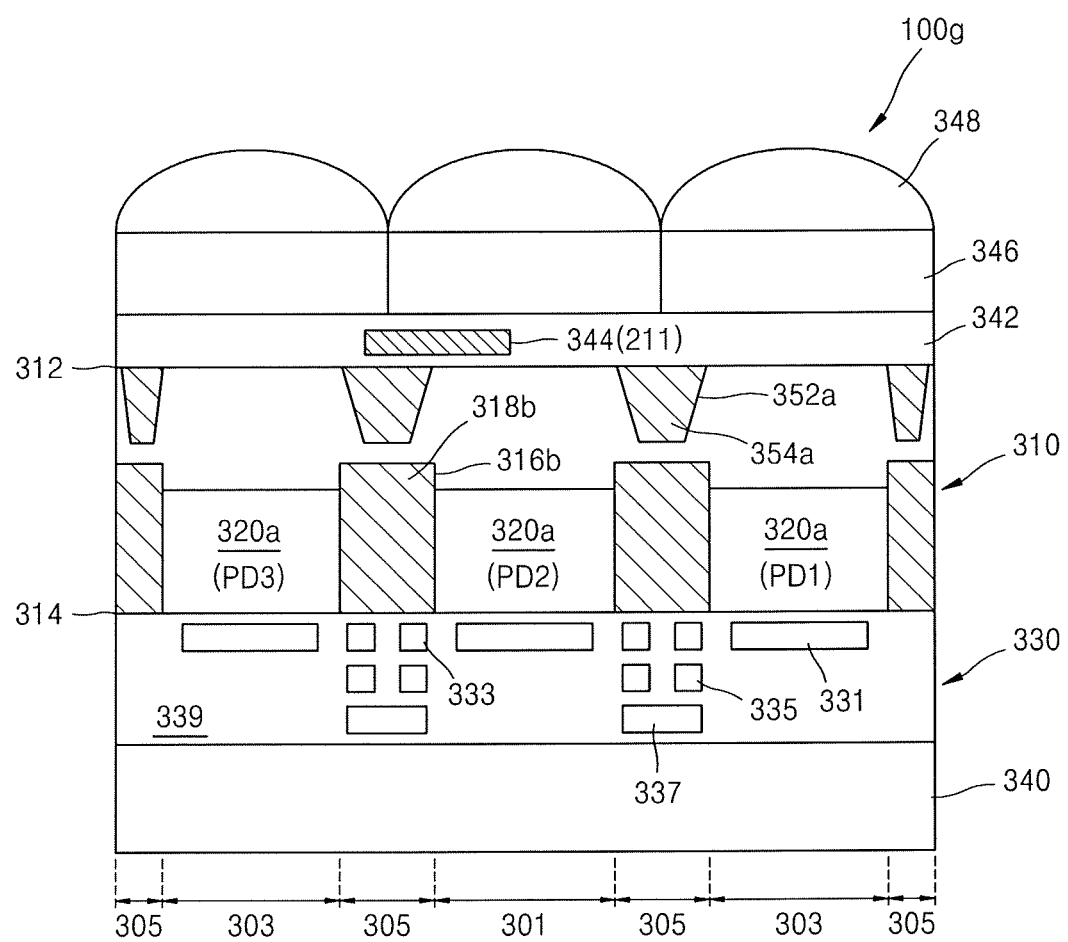
FIG. 15 is a cross-sectional view illustrating an image sensor according to an embodiment of the present inventive concept, in which a phase detection method is used.

FIG. 15 is a cross-sectional view illustrating an image sensor 100g according to an embodiment of the present inventive concept, in which a phase detection method is used.

Referring to FIG. 15, the image sensor 100g may have substantially the same structure as that of the image sensor 100f illustrated in FIG. 14 except for a second pixel isolation layer 354a. Thus, for convenience of description, duplicate description of the image sensor 100g in FIG. 15 with the image sensor 100f in FIG. 14 will be omitted or briefly described.

A second partial isolation trench 316b may be formed in a direction extending (e.g., extending perpendicularly) from the first surface 314 to the second surface 312 and spaced apart from the second surface 312 as described with reference to FIG. 14. An insulation material layer may be buried in the pixel isolation layer 318b. The second partial isolation trench 316b and the pixel isolation layer 318b may be formed in the image sensor 100g.

In the image sensor 100g, a second partial trench 352a may be formed in a direction extending (e.g., extending perpendicularly) from the second surface 312 to the first surface 314. The second partial trench 352a might not abut on the second partial isolation trench 316b and may be spaced apart from the second partial isolation trench 316b. An insulation material layer is buried in the second partial trench 352a to form the second pixel isolation layer 354a. The image sensor 100g may separate the light sensing regions 320a securely by the second pixel isolation layer 354a.

Figure 16:
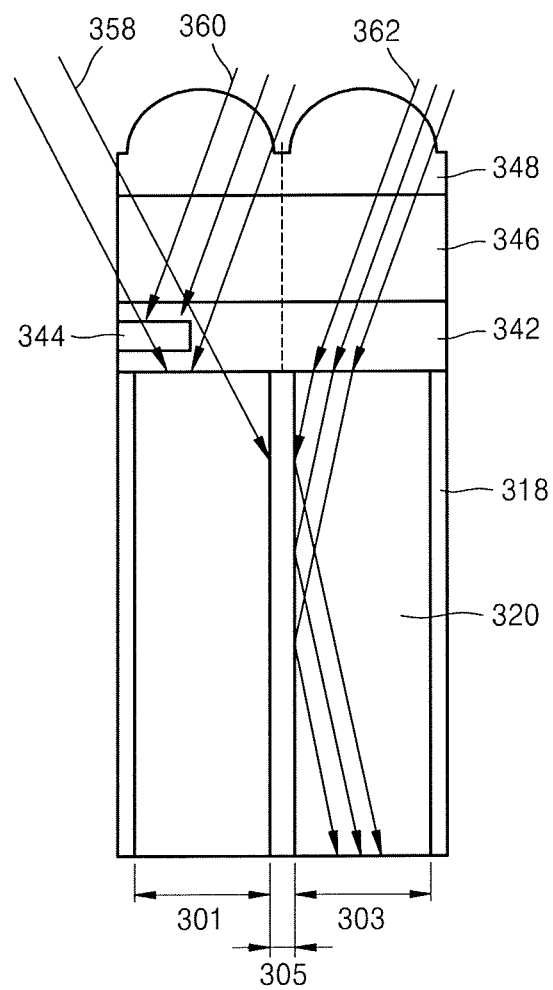
FIGS. 16 and 17 are diagrams illustrating crosstalk of an image sensor according to an embodiment of the present inventive concept and crosstalk of an image sensor according to a comparative example.
Figure 17:
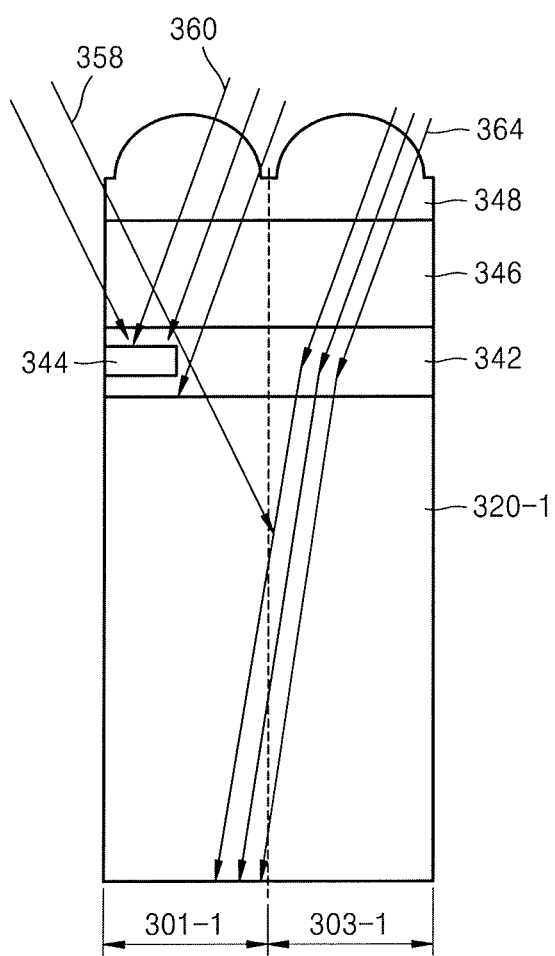

FIGS. 16 and 17 are diagrams illustrating crosstalk of an image sensor according to an embodiment of the present inventive concept and crosstalk of an image sensor according to a comparative example.

In detail, an image sensor of FIG. 16 may include a phase detection autofocusing pixel 301, a general pixel 303, and a pixel isolation region 305, as described above. Light sensing regions 320 and a pixel isolation layer 318 that separates the light sensing regions 320 are formed in the image sensor of FIG. 16.

An image sensor according to a comparative example, as illustrated in FIG. 17 may include a phase detection autofocusing pixel 301-1 and a general pixel 303-1. The image sensor according to the comparative example of FIG. 17 may include a light sensing region 320-1. The image sensors of FIGS. 16 and 17 may each include an insulation layer 342, a light shielding layer 344, a color filter layer 346, and a microlens layer 348.

In the image sensor according to an embodiment of the present inventive concept illustrated in FIG. 16, light 358 and light 360 is incident from the left and the right with respect to the light shielding layer 344 of the phase detection autofocusing pixel 301, and light 362 is incident from the right side of the general pixel 303.

The light 358 and the light 360 that are incident on the phase detection autofocusing pixel 301 are not incident on the general pixel 303 due to the pixel isolation region 305 including the pixel isolation layer 318, as illustrated in FIG. 16. In addition, the light 362 incident on the general pixel 303 is not incident on the phase detection autofocusing pixel 301 due to the pixel isolation region 305 including the pixel isolation layer 318, as illustrated in FIG. 16.

In the image sensor according to the comparative example illustrated in FIG. 17, light 358 and light 360 are incident from the left and the right with respect to the light shielding layer 344 of the phase detection autofocusing pixel 301-1, and light 364 is incident from the right side of the general pixel 303-1. The light 358 and the light 360 incident on the phase detection autofocusing pixel 301-1 are incident on the general pixel 303-1 to cause optical crosstalk. In addition, the light 364 incident on the general pixel 303 is incident on the phase detection autofocusing pixel 301 to decrease autofocusing performance.

Although descriptions with reference to FIGS. 16 and 17 are focused on optical crosstalk and autofocusing, electrical crosstalk may also be reduced in the image sensor according to an embodiment of the present inventive concept by using the pixel isolation region 305 that includes the pixel isolation layer 318. Accordingly, the image sensor according to an embodiment of the present inventive concept may reduce the optical crosstalk and the electrical crosstalk and may increase the autofocusing performance.

FIGS. 18 through 22 are cross-sectional views illustrating a method of manufacturing an image sensor according to an embodiment of the present inventive concept.

Figure 18:
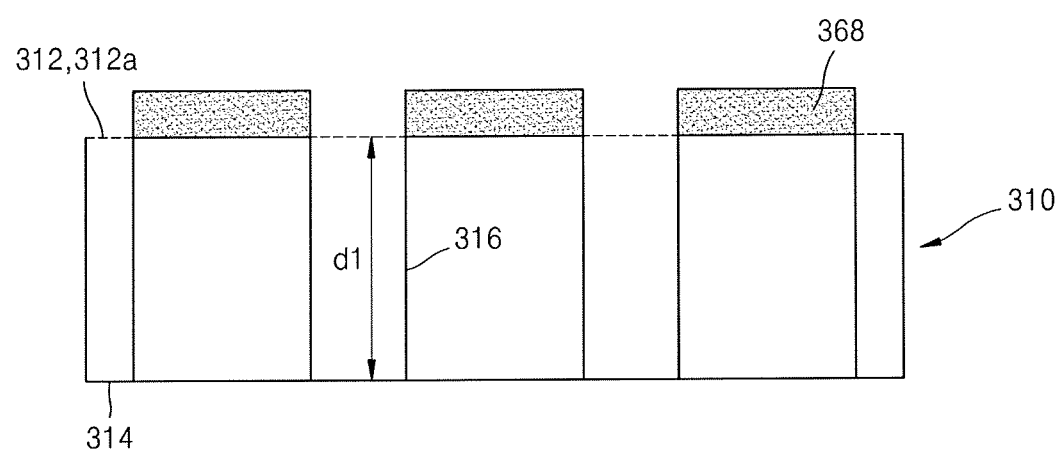
FIGS. 18 through 22 are cross-sectional views illustrating a method of manufacturing an image sensor according to an embodiment of the present inventive concept.

Referring to FIG. 18, a semiconductor layer 310 having a first surface 314 and second surfaces 312 and 312a is prepared. The semiconductor layer 310 may include a silicon substrate, and the first surface 314 may be a front surface of the silicon substrate and the second surfaces 312 and 312a may be a rear surface of the silicon substrate. The second surface 312a of the semiconductor layer 310 may be a rear surface of the silicon substrate before it is grinded.

A mask pattern 368 is formed on the second surface 312 of the semiconductor layer 310. The mask pattern 368 is used as an etching mask to etch the semiconductor layer 310 in a direction extending (e.g., extending perpendicularly) from the second surfaces 312 and 312a to the first surface 314, and thus an isolation trench 316 is formed. The isolation trench 316 may have a depth d1. The depth d1 may be about 0.05 μm to about 10 μm. The isolation trench 316 may be formed to pass through the semiconductor layer 310. In an embodiment of the present inventive concept, the isolation trench 316 may be formed to not pass through the semiconductor layer 310.

Figure 19:
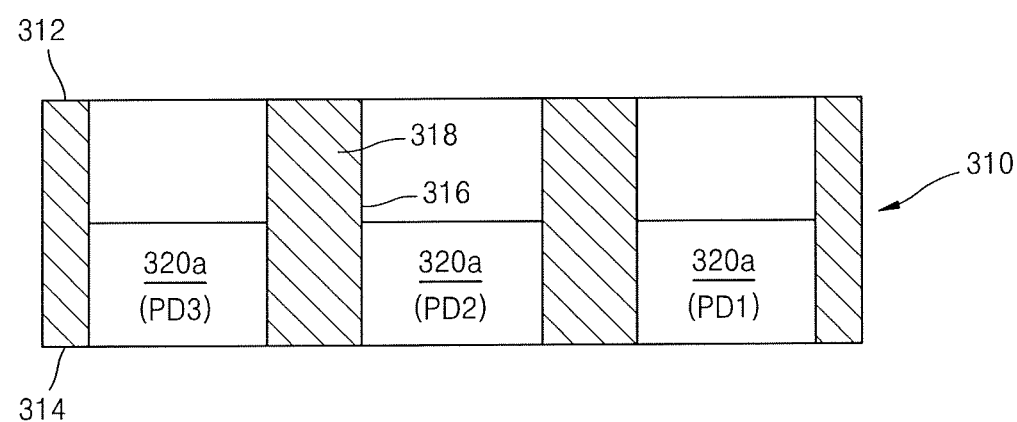

Referring to FIG. 19, a pixel isolation layer 318 is formed by forming an insulation material layer in the isolation trench 316. Light sensing regions 320a that are separated by the pixel isolation layer 318 are formed from the first surface 314 of the semiconductor layer 310. The second surface 312 of the semiconductor layer 310 may be grinded before or after the light sensing regions 320a are formed. In an embodiment of the present inventive concept, the second surface 312 of the semiconductor layer 310 may be grinded after the pixel isolation layer 318 is formed.

Figure 20:
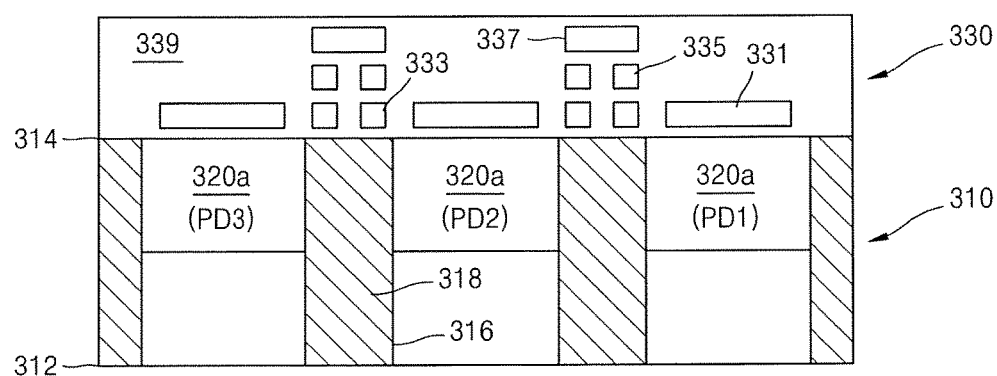

Referring to FIG. 20, a wiring layer 330 is formed on the first surface 314 of the semiconductor layer 310. The wiring layer 330 may include an intermetallic insulation layer 339 and metal wirings 331, 333, 335, and 337 as described above. The intermetallic insulation layer 339 may be formed of an oxide layer, a composite layer formed of an oxide layer and a nitride layer, or the like.

Figure 21:
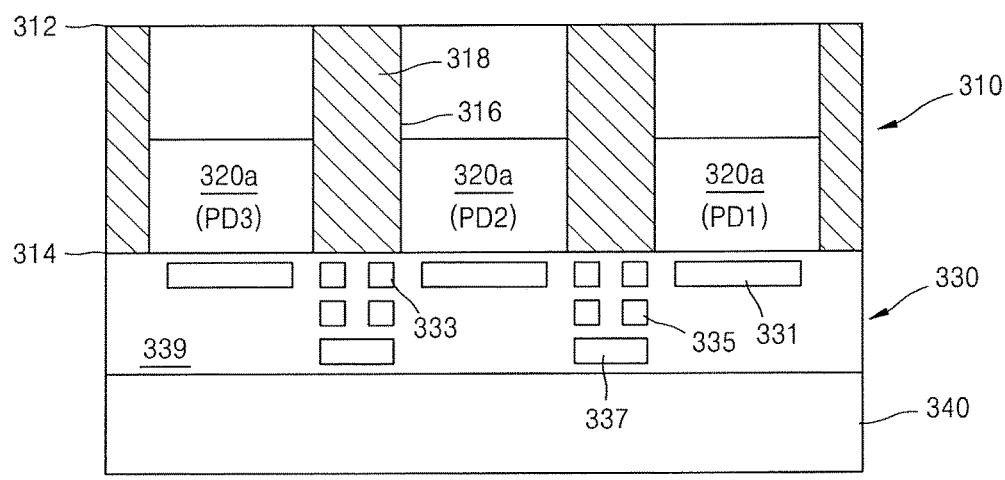
Figure 22:
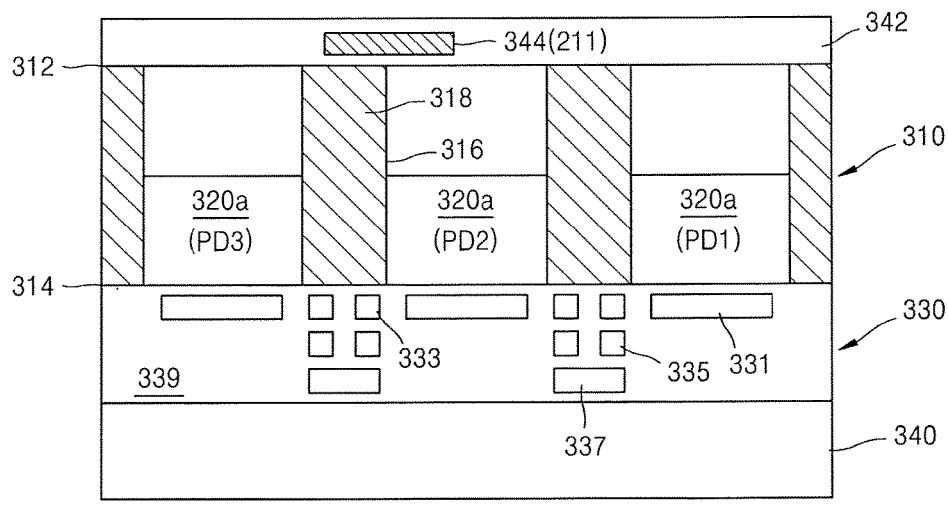

Referring to FIGS. 21 and 22, a carrier substrate 340 is formed on the wiring layer 330. In addition, a light shielding layer 344 (e.g., the light shielding layer 211 of FIGS. 7 and 8) and an insulation layer 342 are formed on the second surface 312 of the semiconductor layer 310. Further, a color filter layer 346 and a microlens layer 348 are formed on the insulation layer 342 as illustrated in, for example, FIG. 9.

FIGS. 23 through 27 are cross-sectional views illustrating a method of manufacturing an image sensor according to an embodiment of the present inventive concept.

Figure 23:
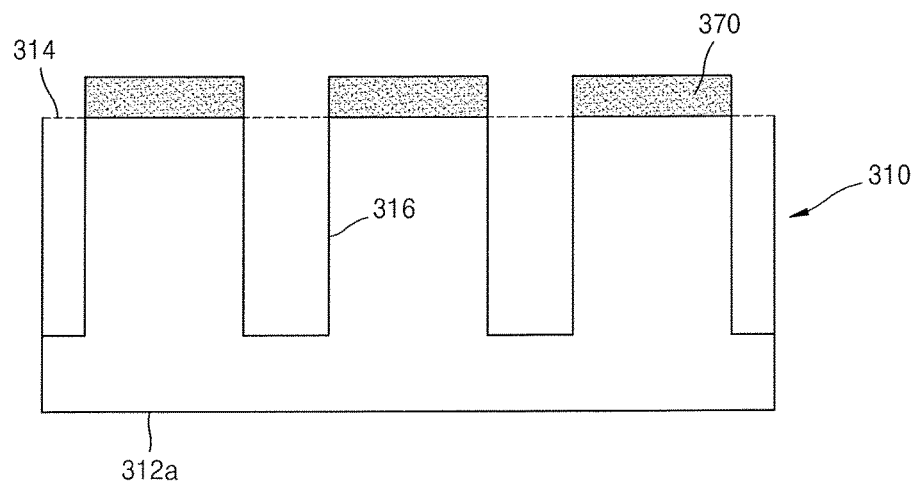
FIGS. 23 through 27 are cross-sectional views illustrating a method of manufacturing an image sensor according to an embodiment of the present inventive concept.

Referring to FIG. 23, a semiconductor layer 310 having a first surface 314 and a second surface 312a is prepared. The semiconductor layer 310 may include a silicon substrate. The first surface 314 may be a front surface of the silicon substrate and the second surface 312a may be a rear surface of the silicon substrate. The second surface 312a of the semiconductor layer 310 may be a rear surface of the silicon substrate before it is grinded.

A mask pattern 370 is formed on the first surface 314 of the semiconductor layer 310. The mask pattern 370 is used as an etching mask to etch the semiconductor layer 310 in a direction extending (e.g., extending perpendicularly) from the first surface 314 to the second surface 312a to form an isolation trench 316. The isolation trench 316 may be formed to not pass through the semiconductor layer 310 as illustrated in FIG. 23. For example, the isolation trench 316 may be formed by etching a portion of the entire thickness of the semiconductor layer 310.

Figure 24:
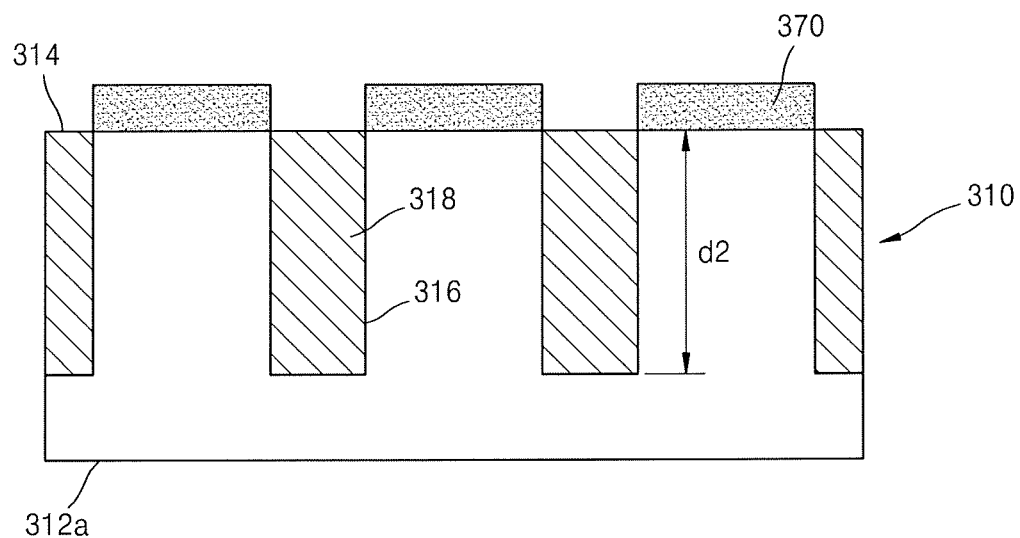
Figure 25:
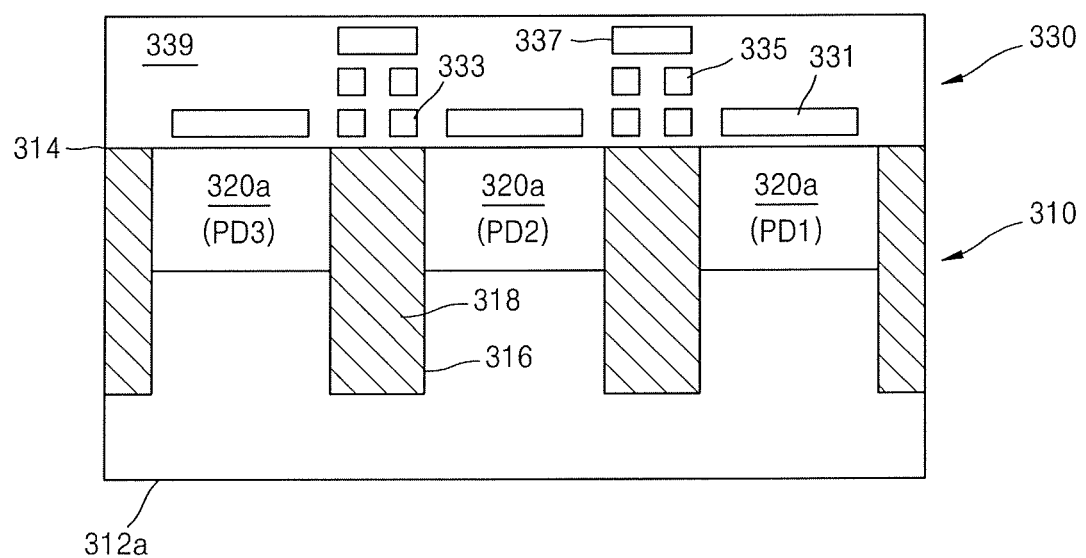

Referring to FIGS. 24 and 25, a pixel isolation layer 318 is formed by forming an insulation material in the isolation trench 316 as illustrated in FIG. 24. The pixel isolation layer 318 may have a depth d2. The depth d2 may be about 0.05 μm to about 10 μm. The pixel isolation layer 318 may be formed before or after the mask pattern 370 is removed.

As illustrated in FIG. 25, light sensing regions 320a that are separated by the pixel isolation layer 318 are formed at the first surface 314 of the semiconductor layer 310. A wiring layer 330 is formed on the first surface 314 of the semiconductor layer 310. For example, the light sensing regions 320a may be formed in a direction extending (e.g., extending perpendicularly) from the first surface 314 to the second surface 312a. The wiring layer 330 may include an intermetallic insulation layer 339 and metal wirings 331, 333, 335, and 337 as described above. The intermetallic insulation layer 339 may be formed of an oxide layer, a composite layer formed of an oxide layer and a nitride layer, or the like.

Figure 26:
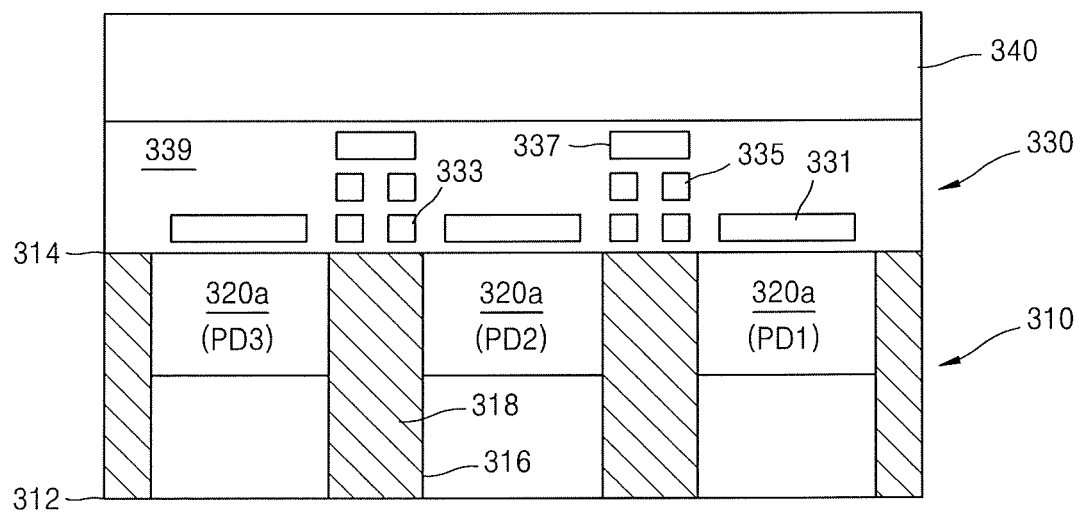
Figure 27:
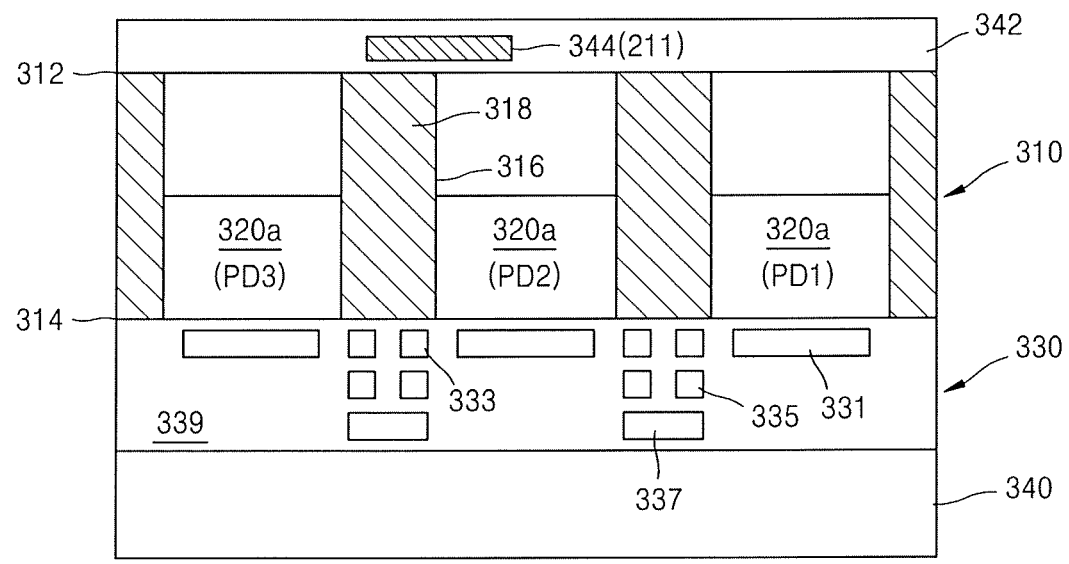

Referring to FIGS. 26 and 27, the second surface 312a of the semiconductor layer 310 in e.g., FIG. 25 is grinded to reduce a thickness of the semiconductor layer 310 as illustrated in FIG. 26, and accordingly, the semiconductor layer 310 may have a second surface 312. Further, a carrier substrate 340 is formed on the wiring layer 330.

As illustrated in FIG. 27, a light shielding layer 344 (e.g., the light shielding layer 211 of FIGS. 7 and 8) and an insulation layer 342 are formed on the second surface 312 of the semiconductor layer 310. Further, as illustrated in FIG. 9 or the like, a color filter layer 346 and a microlens layer 348 are formed on the insulation layer 342.

Figure 28:
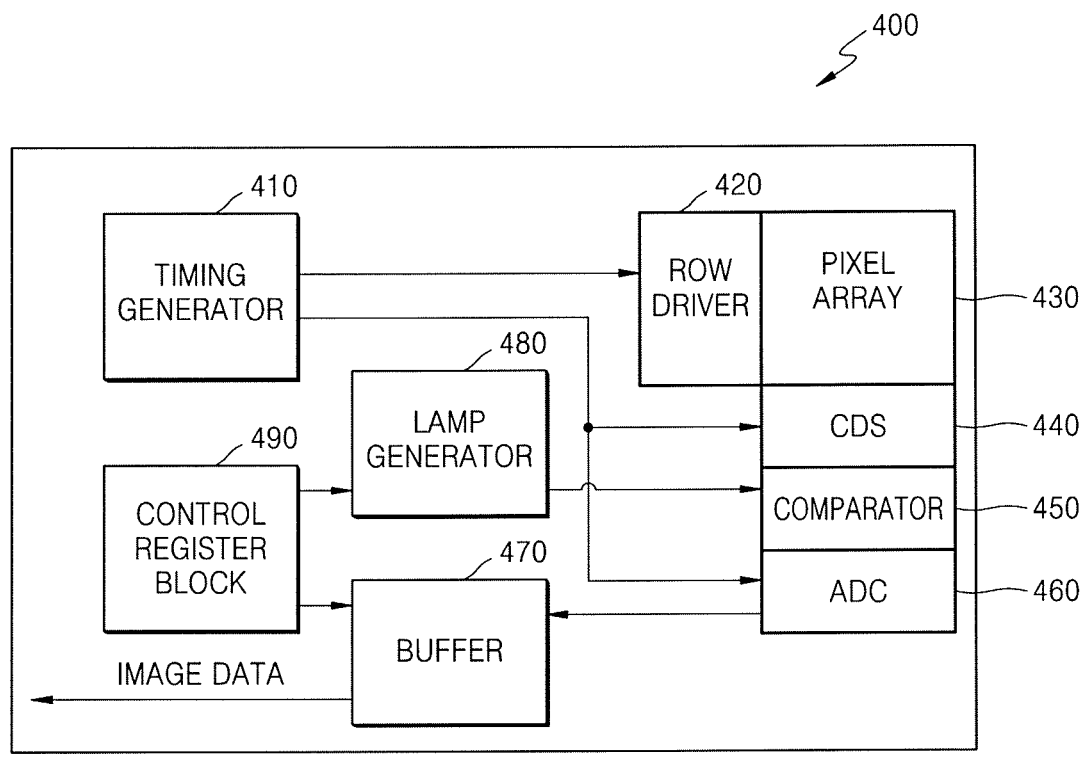
FIG. 28 is a block diagram illustrating an image sensor chip including an image sensor according to an embodiment of the present inventive concept.

FIG. 28 is a block diagram illustrating an image sensor chip 400 including an image sensor according to an embodiment of the present inventive concept.

Referring to FIG. 28, the image sensor chip 400 includes a timing generator 410, a row driver 420, a pixel array 430, a CDS 440, a comparator 450, an ADC 460, a buffer 470, a ramp generator 480, and a control register block 490. The row driver 420, the pixel array 430, the CDS 440, the comparator 450, and the ADC 460 may include the image sensors illustrated in FIGS. 9 through 15.

The row driver 420 provides the pixel array 430 with a signal for driving each of a plurality of pixels. The pixel array 430 converts object information (e.g., optical data) collected by an optical lens to electrons to generate an electrical image signal, and the CDS 440 removes noise from the electrical image signal which is generated by the pixel array 430 to select necessary signals. The comparator 450 compares the selected signals with a predetermined value, and the ADC 460 converts an output of the comparator 450 to digital data. The buffer 460 buffers the digital data output from the ADC 460.

Figure 29:
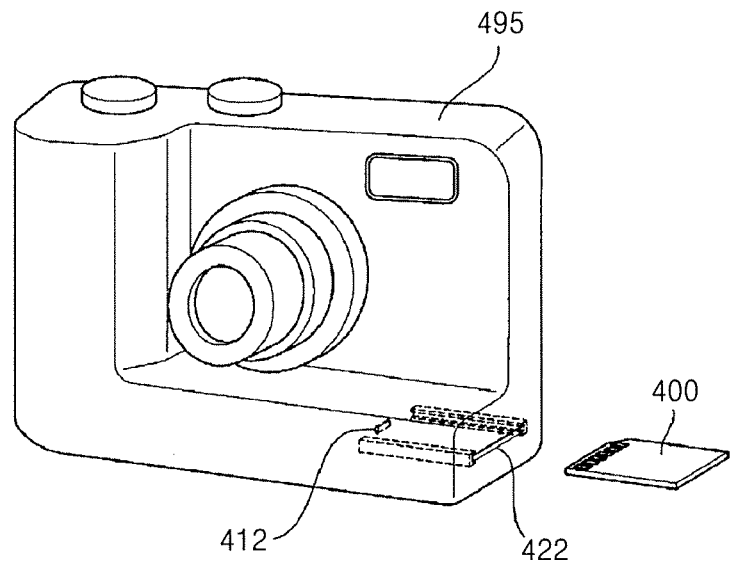
FIG. 29 illustrates a camera device in which the image sensor chip of FIG. 28 is used according to an embodiment of the present inventive concept.

FIG. 29 illustrates a camera device 495 in which the image sensor chip 400 of FIG. 28 is used according to an embodiment of the present inventive concept.

Referring to FIG. 29, the camera device 495 includes a digital signal processor (DSP) 412 in which a camera controller, an image signal processor, or the like is embedded and an insertion portion 422 to which the image sensor chip 400 may be mounted. While the image sensor chip 400 is illustrated as a detachable type in FIG. 29 for convenience of understanding, the present inventive concept is not limited thereto, and the DSP 412 and the image sensor chip 400 may be implemented as a single module.

Figure 30:
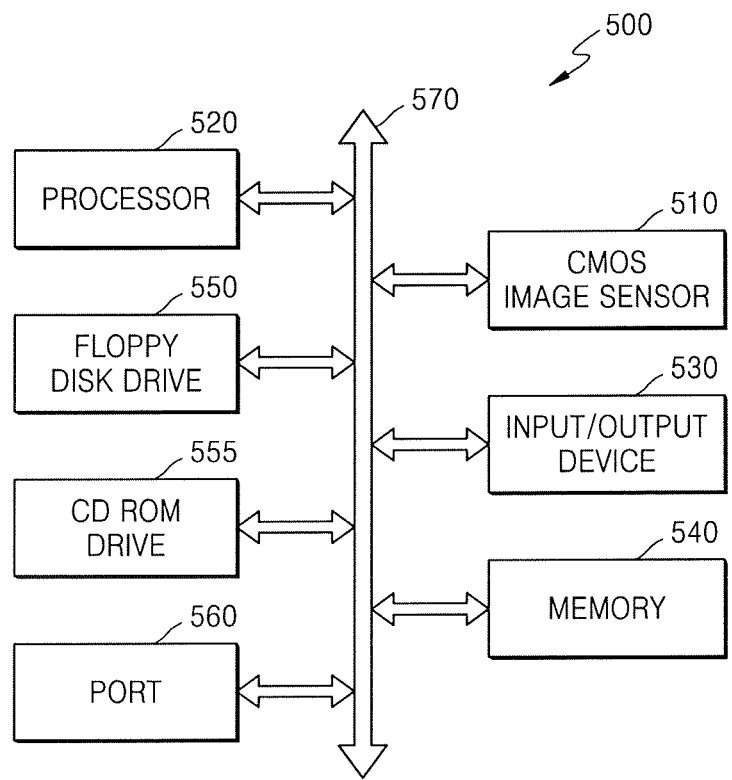
FIG. 30 is a block diagram illustrating an electronic system including an image sensor according to an embodiment of the present inventive concept.

FIG. 30 is a block diagram illustrating an electronic system 500 including an image sensor according to an embodiment of the present inventive concept.

Referring to FIG. 30, the electronic system 500 includes a CMOS image sensor 510 and processes output images of the CMOS image sensor 510. For example, the electronic system 500 may be any system that is mounted with the CMOS image sensor 510 such as a computer system, a camera system, a scanner, an image stabilization system, or the like.

The electronic system 500 may include a processor 520, an input/output device 530, a memory 540, a floppy disk driver 550, and a CD ROM drive 555, and these elements may communicate with one another via a bus 570. The CMOS image sensor 510 may include at least one of the image sensors illustrated in FIGS. 9 through 15.

The CMOS image sensor 510 may receive a control signal or data from other devices of the processor 520 or the electronic system 500. The CMOS image sensor 510 may provide the processor 520 with a signal that defines an image based on the received control signal or data, and the processor 520 may process the signal received from the image sensor 510.

The processor 520 may execute a program and control the electronic system 500. The processor 520 may be, for example, a microprocessor, a digital signal processor, a microcontroller or a similar device thereto.

The input/output device 530 may be used in inputting or outputting data of the electronic system 500. The electronic system 500 may be connected to an external device such as a personal computer, a network, or the like, via the input/output device 530 to exchange data with the external device. The input/output device 530 may be, for example, a keypad, a keyboard, a display, or the like.

The memory 540 may store codes and/or data for operating the processor 520. The memory 540 may store data processed in the processor 520. The port 560 may be connected to a video card, a sound card, a memory card, a USB device, or the like. The port 560 may be used to communicate data with other systems.

While the present inventive concept has been particularly shown and described with reference to exemplary embodiments thereof, it will be understood that various changes in form and details may be made therein without departing from the spirit and scope of the present inventive concept.

What is claimed is:

1. An image sensor comprising:
   a semiconductor layer having a first surface and a second surface opposite to the first surface;
   a plurality of light sensing regions formed in the semiconductor layer and comprising a plurality of general pixels configured to obtain image information and a plurality of phase detection autofocusing pixels configured to detect phase;
   a first pixel isolation layer disposed between adjacent light sensing regions from among the plurality of light sensing regions, the first pixel isolation layer being buried in a first isolation trench formed between the first surface and the second surface;
   a light shielding layer formed on the second surface of the semiconductor layer and at least partially overlapping the plurality of phase detection autofocusing pixels of the plurality of light sensing regions; and
   a wiring layer formed on the first surface of the semiconductor layer.

2. The image sensor of claim 1, wherein the adjacent light sensing regions are spaced apart from the first pixel isolation layer.

3. The image sensor of claim 1, wherein the first isolation trench is formed in a first direction extending from the second surface to the first surface or in a second direction extending from the first surface to the second surface, the first isolation trench abutting on the first and second surfaces, wherein the first pixel isolation layer is an insulation material layer buried in the first isolation trench.

4. The image sensor of claim 1, wherein the first isolation trench is formed in a first direction extending from the second surface to the first surface, the first isolation trench being spaced apart from the first surface, wherein the first pixel isolation layer is an insulation material layer buried in the first isolation trench.

5. The image sensor of claim 1, wherein the first isolation trench is formed in a second direction extending from the first surface to the second surface, the first isolation trench being spaced apart from the second surface, wherein the first pixel isolation layer is an insulation material layer buried in the first isolation trench.

6. The image sensor of claim 1, wherein a liner layer is formed on an inner wall of the first isolation trench.

7. The image sensor of claim 1, wherein an insulation layer is formed on the second surface of the semiconductor layer, and the light shielding layer is formed in the insulation layer.

8. The image sensor of claim 1, wherein an insulation layer is formed on the second surface of the semiconductor layer, and the light shielding layer is formed directly on the second surface of the semiconductor layer.

9. The image sensor of claim 1, wherein the first pixel isolation layer is formed of a material having a lower refractive index than a material of which the semiconductor layer is formed.

10. The image sensor of claim 1, wherein the plurality of general pixels of the plurality of light sensing regions are not overlapped by the light shielding layer.

11. The image sensor of claim 1, wherein the plurality of general pixels is interspersed with the plurality of phase detection autofocusing pixels.

12. An image sensor comprising:
    a first unit pixel comprising a first light sensing region formed in a first portion in a semiconductor layer that has a first surface and a second surface opposite to the first surface;
    a second unit pixel comprising a second light sensing region formed in a second portion of the semiconductor layer, wherein the second light sensing region abuts on the first portion in the semiconductor layer;
    a first pixel isolation region comprising a first pixel isolation layer buried in a first isolation trench formed between the first and second surfaces of the semiconductor layer, the first pixel isolation layer isolating the first and second unit pixels from each other;
    a light shielding layer disposed on either the first unit pixel but not the second unit pixel or the second unit pixel but not the first unit pixel, the light shielding layer shielding light incident through the second surface; and
    a wiring layer formed on the first surface of the semiconductor layer.

13. The image sensor of claim 12, wherein the first isolation trench is formed in a first direction extending from the second surface to the first surface or in a second direction extending from the first surface to the second surface, the first isolation trench abutting on the first and second surfaces.

14. The image sensor of claim 12, wherein the first isolation trench is formed in a first direction extending from the second surface to the first surface, the first isolation trench being spaced apart from the first surface.

15. The image sensor of claim 12, wherein the first isolation trench is formed in a second direction extending from the first surface to the second surface, the first isolation trench being spaced apart from the second surface, and wherein a second isolation trench is formed, in the semiconductor layer, in a first direction extending from the second surface to the first surface, and a second pixel isolation layer is formed in the second isolation trench, and wherein the second isolation trench abuts on the first isolation trench.

16. The image sensor of claim 12, wherein an insulation layer is formed on the second surface of the semiconductor layer, and the light shielding layer is formed in the insulation layer.

17. An image sensor comprising:
    a pixel array region including a first unit pixel, a second unit pixel, and a first pixel isolation region disposed between the first unit pixel and the second unit pixel; and logic region disposed around edges of the pixel array region and including electronic devices, wherein the electronic devices of the logic region and including electronic driving signals to the first unit pixel and the second unit pixel, wherein the first unit pixel includes a first light sensing region formed in a first portion in a semiconductor layer having a first surface and a second surface opposite to the first surface, wherein the second unit pixel includes a second light sensing region formed in a second portion of the semiconductor layer, wherein the first pixel isolation region includes a first pixel isolation layer isolating the first and second unit pixels from each other, and wherein the image sensor further comprises a light shielding layer formed on the first light sensing region but not the second light sensing region or the second light sensing region but not the first light sensing region.

18. The image sensor of claim 17, further comprising a wiring layer formed on the first surface of the semiconductor layer.

19. The image sensor of claim 17, wherein the electronic devices of the logic region include:
- a row driver providing the driving signals to the first and second unit pixels;
- a correlated double sampler receiving an output signal from the first and second unit pixels and outputting a first value corresponding to a difference between a reference noise level and a level of the output signal from the first and second unit pixels; and
- an analog-to-digital converter converting an analog signal corresponding to the first value to a digital signal and outputting the converted digital signal.

* * * * *